United States Patent [19]
Adams

[11] Patent Number: 5,587,687
[45] Date of Patent: Dec. 24, 1996

[54] MULTIPLIER BASED TRANSCONDUCTANCE AMPLIFIERS AND TRANSCONDUCTANCE CONTROL CIRCUITS

[75] Inventor: William J. Adams, Irvine, Calif.

[73] Assignee: Silicon Systems, Inc., Tustin, Calif.

[21] Appl. No.: 383,310

[22] Filed: Feb. 2, 1995

[51] Int. Cl.[6] ........................................ H03F 3/45
[52] U.S. Cl. ................ 330/253; 330/254; 330/300; 327/359
[58] Field of Search ........................ 327/356, 359; 330/253, 254, 300

[56] References Cited

U.S. PATENT DOCUMENTS

| | | | |
|---|---|---|---|
| 3,662,187 | 5/1972 | Ayres et al. | 327/359 |
| 5,107,150 | 4/1992 | Kimura | 327/359 X |
| 5,151,625 | 9/1992 | Zarabadi et al. | 327/113 X |

OTHER PUBLICATIONS

"A BiCMOS Los-Distortion 8-MHz Loss-Pass Filter", Scott D. Willingham, Kenneth W. Martin, A. Ganesan, *IEEE Journal of Solid-State Circuits*, vol. 28, No. 12, Dec. 1993.

*Primary Examiner*—Steven Mottola
*Attorney, Agent, or Firm*—Blakely, Sokoloff, Taylor & Zafman

[57] ABSTRACT

Multiplier based transconductance amplifiers utilizing the combination of FET differential input stages and Gilbert multiplier output stages are disclosed. The amplifiers provide a high input resistance, high output resistance, and wide $g_m$ adjustment range without need for output level-shifting stages. Also disclosed are various transconductance control circuits which require only a simple one-transistor voltage buffer in the feedback loop rather than the two more complex voltage amplifiers required by the prior art. Various embodiments are disclosed.

32 Claims, 28 Drawing Sheets

MULTIPLIER BASED TRANSCONDUCTANCE AMPLIFIERS AND TRANSCONDUCTANCE CONTROL CIRCUITS

BACKGROUND OF THE INVENTION

1. Field of the Invention

The present invention relates to the field of transconductance amplifiers and transconductance control.

2. Prior Art

Transconductance amplifiers are the active elements in an important class of continuous-time filters. Desirable features of a transconductance amplifier are a high input resistance, high output resistance, a linear I-V transfer characteristic, and a means of post-fabrication transconductance ($g_m$) adjustment. For high-frequency applications, it is also desirable that the parasitic poles of the transconductance amplifier occur at frequencies much higher than the critical frequencies of the system.

FIG. 1 shows a prior art bipolar transconductance amplifier based on the Gilbert multiplier. The $g_m$ of this transconductance amplifier may be expressed as $$g_m = g_{md} \frac{I_2}{I_1} \quad (1)$$

where $g_{md}$ is the transconductance of the input differential amplifier formed by Q1, Q2, RE and IEE, and $I_2/I_1$ is the gain of the current multiplier formed by Q3, Q4, Q5, Q6 and $2I_2$. The current I1 represents the DC emitter current in each of transistors Q3 and Q4; neglecting the effect of the finite beta of Q1, Q2, Q5 and Q6, I1 is seen to be equal to IEE. The current I2 represents the DC emitter current in each of transistors Q5 and Q6, the sum being $2I_2$.

Note from (1) that $g_m$ adjustment can be achieved by varying either $I_1$ (IEE) or $I_2$; however, adjustment of IEE may also adversely affect the linear input range of the input differential amplifier. An additional means of $g_m$ adjustment can be gained by injecting a control current as in the prior art transconductance amplifier of FIG. 2. The $g_m$ of this transconductance amplifier may again be expressed as in (1), but, since the bias current IEE is now approximately the sum of the injected current and the DC emitter current through each of Q3 and Q4, the multiplier current I1 is now given approximately by $$I_1 = I_{EE} - I_{NJ} \quad (2)$$

FIG. 3 shows a more complete version of the transconductance amplifier of FIG. 1. Included in FIG. 3 are:

cascode devices Q7 and Q8 to provide a higher output resistance;

high output resistance load devices ILOAD and ILOAD*; and emitter follower stages Q9, IEE9 and Q10, IEE10 necessary to shift the DC output voltage down to a level appropriate for the input of an identical cascaded transconductance amplifier.

The emitter follower stage has several undesirable effects. For one, the input resistance of the emitter follower is in parallel with the transconductance amplifier output resistance; hence, it effectively reduces the output resistance of the transconductance amplifier. Also, in a cascaded transconductance amplifier structure, the emitter follower introduces an additional delay in the signal path; i.e., it leads to an additional high-frequency parasitic pole. Other obvious disadvantages include the increased power dissipation and circuit area required by the emitter followers.

FIG. 4 shows a prior art BiMOS transconductance amplifier in which the input devices are MOSFETs biased in the triode (linear) region of operation. Unlike the prior art transconductance amplifier of FIG. 3, the transconductance amplifier of FIG. 4 can easily be designed such that DC level shifting from the output of one amplifier to the input of an identical cascaded amplifier is not required; hence, the complexities of an additional level shifting stage may be avoided. An additional advantage of the transconductance amplifier of FIG. 4 is that the MOSFET devices provide a much higher input resistance than would a BJT input device; thus, cascading of the MOSFET structures will be much less detrimental to the transconductance amplifier's output resistance.

One possible disadvantage of the transconductance amplifier of FIG. 4 is that its range of $g_m$ adjustment (via VDS adjustment) may be somewhat more limited than the multiplier-based BJT transconductance amplifier of FIG. 3; a $g_m$ adjustment by a factor of 4 has been reported for the circuit of FIG. 4, while a factor greater than 10 has been reported for the circuit of FIG. 3. It should also be noted that a significant portion of the adjustment range obtained for the amplifier of FIG. 4 will likely be necessary solely to overcome process-dependent parameter variations in the MOSFET devices.

What is needed is a transconductance amplifier which provides a high input resistance, high output resistance, and wide $g_m$ adjustment range without need for output level-shifting stages.

In addition to a specific transconductance amplifier circuit implementation, the use of transconductance amplifiers as system building blocks usually requires some means of control of the transconductance parameter of these amplifiers in order that system specifications remain within given tolerances over a wide range of temperature, processing and other variations. One approach to the problem is to design some sort of feedback circuit which monitors the output of a secondary system (whose specifications are closely matched to the specifications of the primary system) and adjusts the individual $g_m$'s such that the error between the secondary system output and the desired secondary system output remains small. An example of this approach is the use of phase-locked-loops and master-slave configurations in $g_m$-C filters.

An alternative approach to the control of transconductor-based systems is to employ transconductors whose $g_m$ variation with temperature is a well known and easily reproduced function; the bias current or voltage which controls the transconductor can then be made to follow a similar function of temperature such that the $g_m$ remains constant over temperature. This approach is sometimes used with BJT-based transconductors where, like a single BJT, the $g_m$ is directly proportional to the quotient of a collector bias current and the absolute temperature; by supplying the transconductor with a bias current which is proportional to absolute temperature, the $g_m$ remains approximately constant. As for variations in system specifications due to processing variations (e.g., variations of capacitance values in $g_m$-C filters), these may be overcome by a one-time trimming operation as a final fabrication step.

Although the latter approach does thus complicate the fabrication procedure, the savings in circuit area and power dissipation over the former approach can be substantial; in addition, the absence of a secondary system's transient signals may result in an improvement in system performance for the latter approach. The latter approach, however, is poorly suited for use with FET-based transconductors, for which the $g_m$ value is typically a more complex function of temperature and bias current than in the case of the BJT-based transconductor. In practice, even the $g_m$ value of a BJT-based transconductor can exhibit deviations from an ideal proportional relationship between bias current and absolute temperature.

These observations inspire a third approach in which a feedback circuit is used to maintain only the DC $g_m$ value of a reference transconductor, with all transconductors in the primary system being slaved to this reference $g_m$ value. Such control of the DC $g_m$ value of a single transconductor must be expected to be somewhat simpler than the control of the specification(s) of the more complicated secondary systems typically found in master-slave configurations. At the same time, the zero-frequency nature of this third approach will not give rise to transients which may detract from the primary system performance.

FIG. 5 is a circuit diagram of a prior art $g_m$ control circuit. The control circuit includes a control transconductor (formed by devices Min1, Min2, Q1 and Q2) identical in structure to the assumed signal-processing transconductor(s) to be controlled. By forcing both a differential reference voltage input and a differential output reference current on the control transconductor, the goal is to force the $g_m$ of this control transconductor to be $$g_{mcontrol} = \frac{I_{ref}}{V_{ref}} \qquad (3)$$

The differential reference voltage input is forced by the inputs VCM+Vref/2 and VCM−Vref/2, providing a differential input voltage value of Vref. The differential output is forced by the current source Iref/2 forcing a corresponding difference Iref in the currents I01 and I02. Amplifier A2 maintains the voltage of the gates of MOSFETs ML1 and ML2 so that the average of the drain voltages of these MOSFETs is equal to the common mode voltage VCM. Since the gate-source voltages of MOSFETs ML1 and ML2 are equal, the corresponding drain-source currents are approximately equal. Amplifier A1 controls the control voltage $V_{control}$ to drive the difference in the voltages V01 and V02 to a minimum. This holds the differential current output at Iref for the differential input voltage Vref, forcing $g_{mcontrol}$ to the value given by equation (3).

Assuming triode-region operation of MOSFETs Min1 and Min2

$$I_D = \mu Cox \frac{W}{L} \left( V_{GS} - V_T - \frac{1}{2} V_{DS} \right) V_{DS}$$

where: μ=mobility of the channel region of the MOSFET devices

Cox=gate oxide capacitance per unit area

W/L=ratio of width to length of the channel region of the MOSFET devices $V_{GS}$=gate-source voltage of the MOSFET devices $V_T$=threshold voltage of the MOSFET devices $V_{DS}$=drain-source voltage of the MOSFET devices and assuming transistors Q1 and Q2 operate in their linear region with approximately the same base-emitter voltage drops $V_{BE1} \approx V_{BE2} \approx V_{BE}$, it follows that $$g_{mcontrol} = \mu Cox \frac{W}{L} (V_{control} - V_{BE}) \qquad (4)$$

From (4), it is clear that $V_{control}$ may be varied to maintain a constant $g_{mcontrol}$ in spite of variations in FET and BJT parameters μ, Cox, W/L and $V_{BE}$. Recall that $V_{control}$ is under the influence of a feedback loop which includes voltage amplifier A1 to keep the difference $(V_{01}-V_{02})$ small; this translates to keeping approximately the same currents through MOSFETs ML1 and ML2, keeping $I_{01} \approx I_{02} + I_{REF}$, and keeping $$g_{mcontrol} = \frac{I_{01} - I_{02}}{V_{CM} + \frac{1}{2} V_{REF} - \left( V_{CM} - \frac{1}{2} V_{REF} \right)} = \frac{I_{REF}}{V_{REF}} \qquad (5)$$

as desired from (3). Application of the voltage $V_{control}$ to any identical signal-processing transconductors results in the identical $g_m$ value for these elements.

A drawback of the prior art $g_m$ control circuit of FIG. 5 is the need for two differential input voltage amplifiers A1 and A2 with high open-loop gains; such amplifiers can add considerably to the power dissipation and area required by the circuit. What is needed is a $g_m$ control circuit which avoids the complexities of two voltage amplifiers in the feedback loop.

BRIEF SUMMARY OF THE INVENTION

The invention disclosed herein constitutes multiplier based transconductance amplifiers utilizing the combination of FET differential input stages and Gilbert multiplier output stages. The amplifiers provide a high input resistance, high output resistance, and wide $g_m$ adjustment range without need for output level-shifting stages. Also disclosed are various transconductance control circuits which require only a simple one-transistor voltage buffer in the feedback loop rather than the more complex voltage amplifiers required by the prior art. Various embodiments are disclosed.

DETAILED DESCRIPTION OF THE INVENTION

The present invention makes use of a MOSFET input stage together with a Gilbert multiplier stage. The MOSFET input stage yields a high input resistance and some degree of $g_m$ adjustment, while the Gilbert multiplier stage provides a wider $g_m$ adjustment range and a high output impedance.

Figure 6:
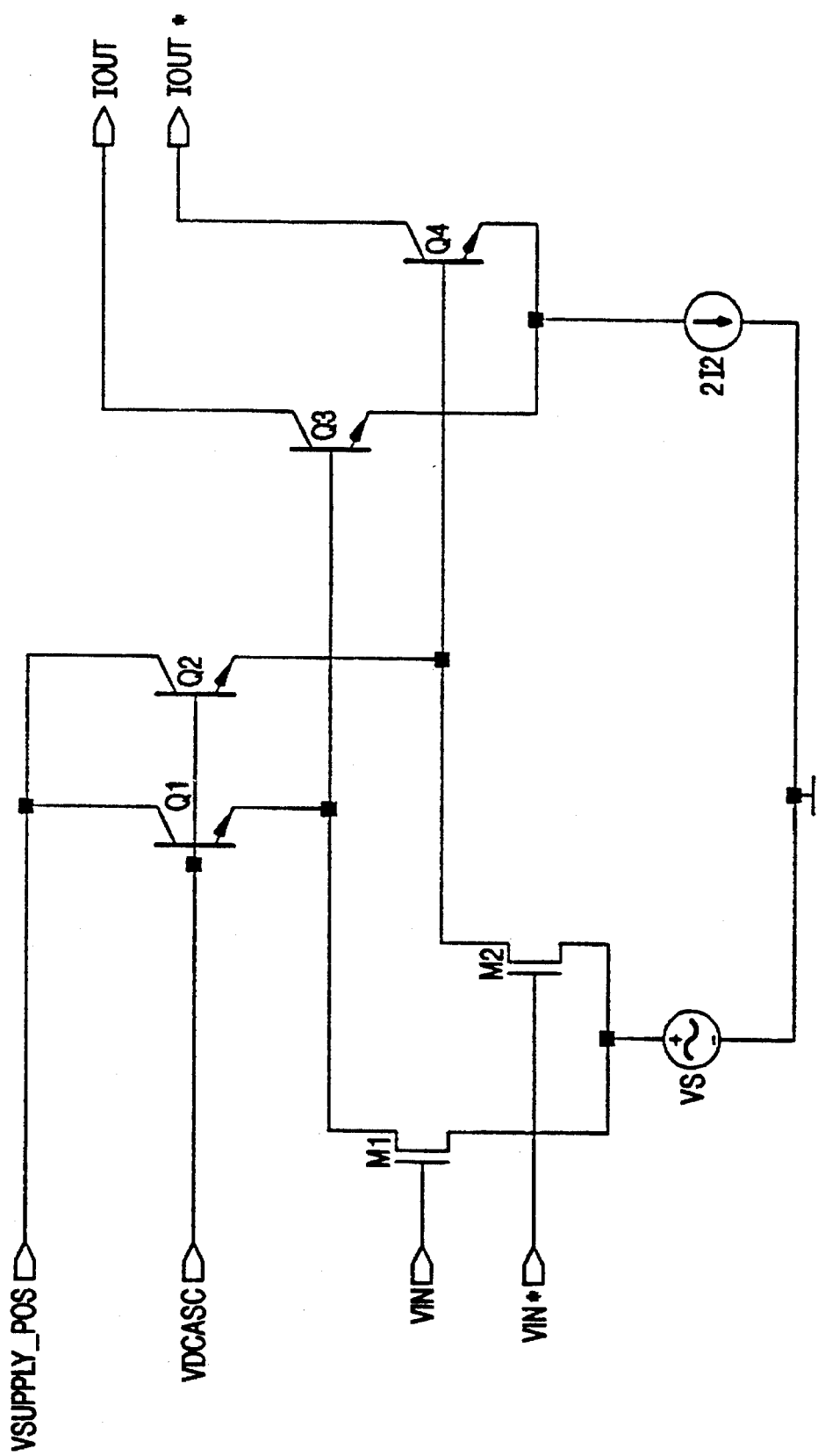
FIG. 6 is a circuit diagram for a first embodiment of the present invention.

FIG. 6 shows one embodiment of the present invention. The overall $g_m$ of the transconductance amplifier may again be expressed as in (1), which is repeated here for convenience $$g_m = g_{md} \frac{I_2}{I_1} \quad (6)$$

where $g_m$ is now the transconductance of the MOSFET input stage formed by MOSFETs M1 and M2 and $I_2/I_1$ is again the current gain of the Gilbert multiplier formed by Q1 through Q4. Assume that MOSFETs M1 and M2 operate in the triode region ($V_{DS} < V_{GS} - V_T$) with drain current modeled as:

$$I_D = \mu C_{ox} \frac{W}{L} \left( V_{GS} - V_T - \frac{V_{DS}}{2} \right) V_{DS} \quad (7)$$

where:

$V_{GS}$=the gate-source voltage of MOSFET M1 or M2

$V_T$=the threshold voltage of MOSFET M1 or M2

$V_{DS}$=the drain-source voltage of MOSFET M1 or M2 and note that, since the emitters of Q1, Q2 are low-impedance nodes, the drain-to-source voltages across MOSFETs M1 and M2 may be assumed constant for small variations in their drain currents ID1, ID2. It follows that:

$$I_{D1,D2} = \quad (8)$$

$$\mu C_{ox} \frac{W}{L} \left( V_{CM} \pm \frac{1}{2} V_d - V_S - V_T - \frac{1}{2} V_{DS} \right) V_{DS}$$

where $V_{CM}=\frac{1}{2}(V_{IN}+V_{IN}^*)$=common-mode component of the differential input signal $V_d=V_{IN}-V_{IN}^*$=differential-mode component of the differential input signal and $$g_{md} = \frac{\partial(I_{D1}-I_{D2})}{\partial V_d} = \mu C_{ox} \frac{W}{L} V_{DS} \quad (9)$$

Combining (6), (8) and (9), the overall $g_m$ may be written as:

$$g_m = \quad (10)$$

$$\mu C_{ox} \frac{W}{L} V_{DS} \frac{I_2}{\mu C_{ox} \frac{W}{L} \left( V_{CM} - V_S - V_T - \frac{V_{DS}}{2} \right) V_{DS}} =$$

$$\frac{I_2}{V_{CM} - V_S - V_T - \frac{V_{DS}}{2}}$$

Note that post-fabrication adjustment of the overall $g_m$ may be easily achieved by adjustment of current source $2I_2$. Eq. (10) indicates that VDS and/or VS may also be used for $g_m$ adjustment, but it must be recognized that such VDS adjustment is limited by the triode-region condition $V_{DS}<V_{GS}-V_T$, and that the linearity of the MOSFET stage may become degraded as VDS approaches the bounding $V_{GS}-V_T$ value.

The embodiment of FIG. 6 will also yield an approximately linear I-V transfer characteristic for the case where both MOSFETs M1 and M2 operate in the saturation region ($V_{DS}>V_{GS}-V_T$) with fully-differential input signals. Assuming the square-law saturation region model:

$$I_D = \frac{\mu C_{ox}}{2} \frac{W}{L} (V_{GS}-V_T)^2 \quad (11)$$

it follows that:

$$I_{D1,D2} = \frac{\mu Cox}{2} \frac{W}{L} \left( V_{CM} \pm \frac{1}{2} V_d - V_S - V_T \right)^2 \quad (12)$$

and:

$$g_{md} = \frac{\partial (I_{D1} - I_{D2})}{\partial V_d} = \mu Cox \frac{W}{L} (V_{CM} - V_S - V_T) \quad (13)$$

Combining (6), (12) and (13) gives the overall $g_m$ for this case as:

$$g_m = \mu Cox \frac{W}{L} (V_{CM} - V_S - V_T) \frac{I_2}{\frac{\mu Cox}{2} \frac{W}{L} (V_{CM} - V_S - V_T)^2} = \frac{2 I_2}{V_{CM} - V_S - V_T} \quad (14)$$

Adjustment of the overall $g_m$ may be achieved via adjustment of $I_2$ or VS.

Note that in the embodiment of FIG. 6, the $g_{md}$ of the MOSFET input stage and the current gain of the multiplier stage are interrelated; i.e., any attempt to adjust the transconductance of the MOSFET stage will result in a change in the DC current through the multiplier devices Q1 and Q2 and a change in the multiplier gain $I_2/I_1$. For a variety of reasons, it may be desirable to decouple the gains of the two stages.

Figure 7:
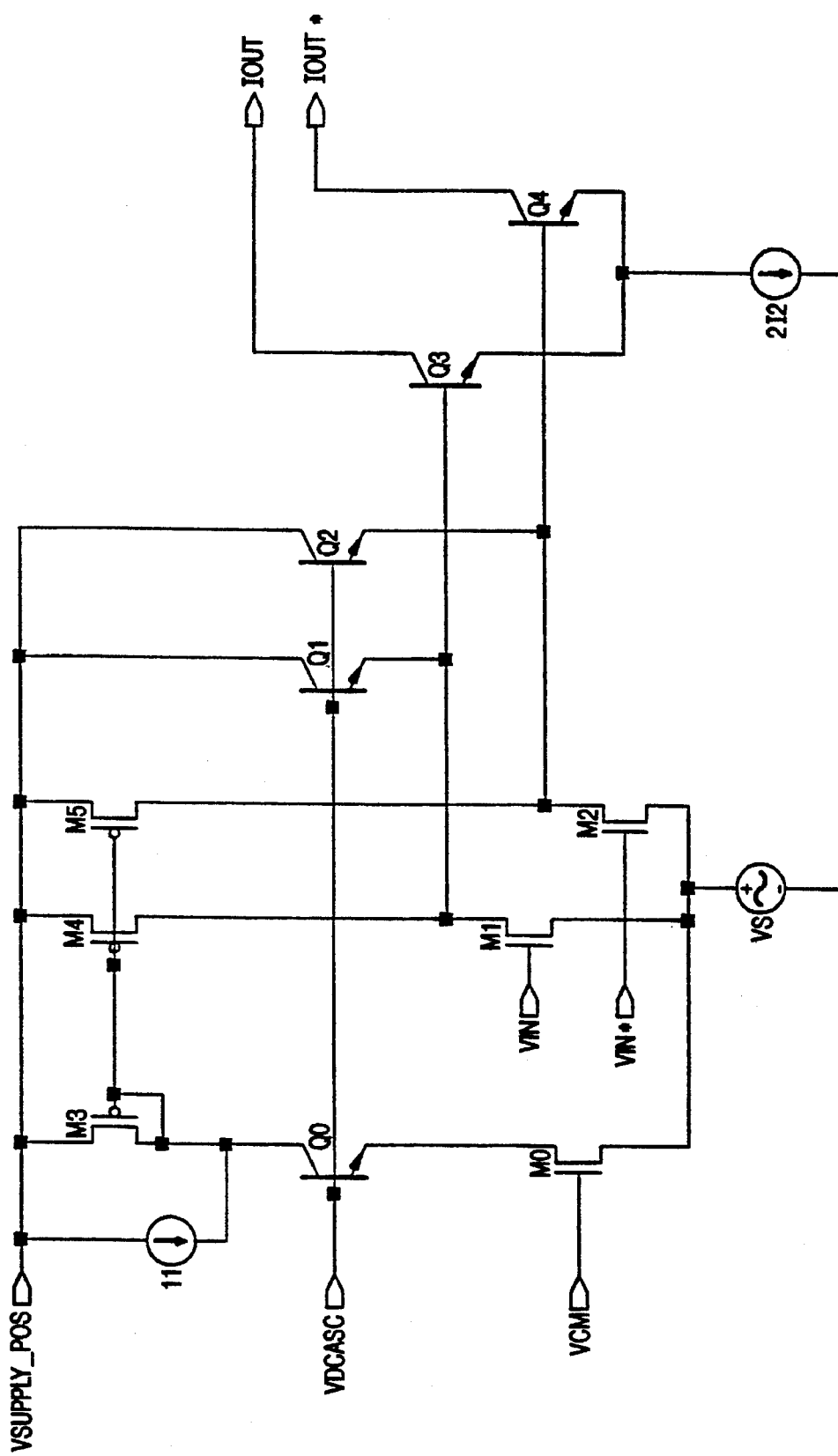
FIG. 7 shows an embodiment of the present invention in which the $g_{md}$ of the MOSFET input stage can be adjusted independently of the current gain of the multiplier.

FIG. 7 shows an embodiment of the present invention in which the $g_{md}$ of the MOSFET input stage can be adjusted independently of the current gain of the multiplier. MOSFET M0, having its gate voltage set at the common mode voltage of the differential input VIN and VIN*, generates the same common mode current as MOSFETs M1 and M2. This current minus the DC current I1 is mirrored by MOSFET M3 to MOSFETs M4 and M5, and is injected into the drains of MOSFETs M1 and M2, respectively. Thus the additional component of current, $I_1$, required by MOSFETs M1 and M2, is provided by the DC current in the emitters of transistors Q1 and Q2. Because the DC current in each of the emitters of Q1 and Q2 remains $I_1$, independent of the voltages VDCASC and VS, $g_m$ of the MOSFET stage may be adjusted via VDS (i.e., via VDCASC and/or VS) adjustment while the multiplier gain remains constant at $I_2/I_1$.

Note that, if the BJT finite β is considered, the accuracy of the embodiment of FIG. 7 will suffer, since the current mirror actually mirrors the current $\alpha I_{D0} - I_1$ $$\left( \text{where } \alpha = \frac{\beta}{\beta + 1} \right)$$

rather than the desired current $I_{DO} - I_1$. Also, the finite β will result in a current $I_2/\beta$ into the base of Q3 and Q4, and this additional DC current in the emitters of Q1 and Q2 will affect the gain of the multiplier stage. The latter concern is easily overcome by including in the source $I_1$ a component equal to $-I_2/\beta$; the mirrored current would then include the necessary $+I_2/\beta$ component. The former concern may also be overcome (albeit with greater difficulty) in a number of ways; for example, Q0 may be replaced with a MOSFET whose gate voltage is controlled such that the drain voltage of M0 equals the DC drain voltage of M1 and M2.

Figure 8:
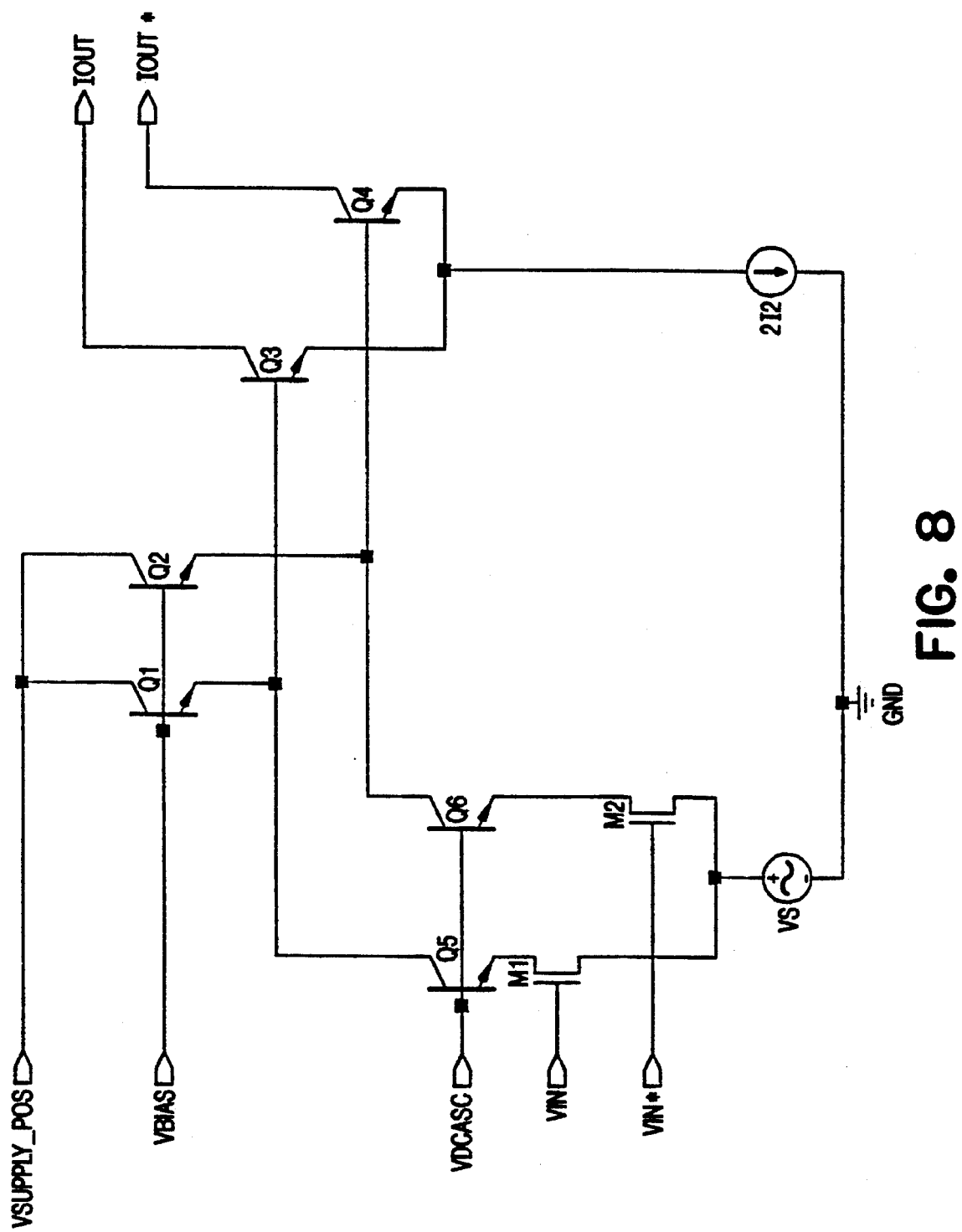
FIG. 8 is a circuit diagram of the embodiment of the present invention of FIG. 7 in which additional cascode devices have been added to permit a smaller voltage at the drains of MOSFETs M1 and M2.

Note that, for the previous embodiments, the lower bound of the MOSFET drain voltage is constrained by the requirement that the base-emitter junctions of Q3 and Q4 remain forward biased; in practice, a voltage drop must also be anticipated across the current source $2I_2$. This constraint may complicate the problem of maintaining $V_{DS} < V_{GS} - V_T$ for MOSFET triode-region operation. FIG. 8 shows an embodiment of the present invention in which additional cascode devices Q5 and Q6 have been added to permit a smaller voltage at the drains of MOSFETs M1 and M2. Devices Q5 and Q6 decouple the drain voltages of MOSFETs M1 and M2 from the bias voltage levels of the multiplier, such that control voltage VDCASC may now be varied to adjust the MOSFET stage $g_{md}$ while the constant voltage VBIAS is chosen sufficiently high to ensure proper operation of the multiplier BJT devices. Control voltage VDCASC may now be varied to adjust the MOSFET stage $g_{md}$ by adjusting the drain voltages of MOSFETs M1 and M2 within the triode region of the devices while the constant VBIAS is chosen sufficiently high to ensure proper operation of the multiplier BJT devices.

Figure 9:
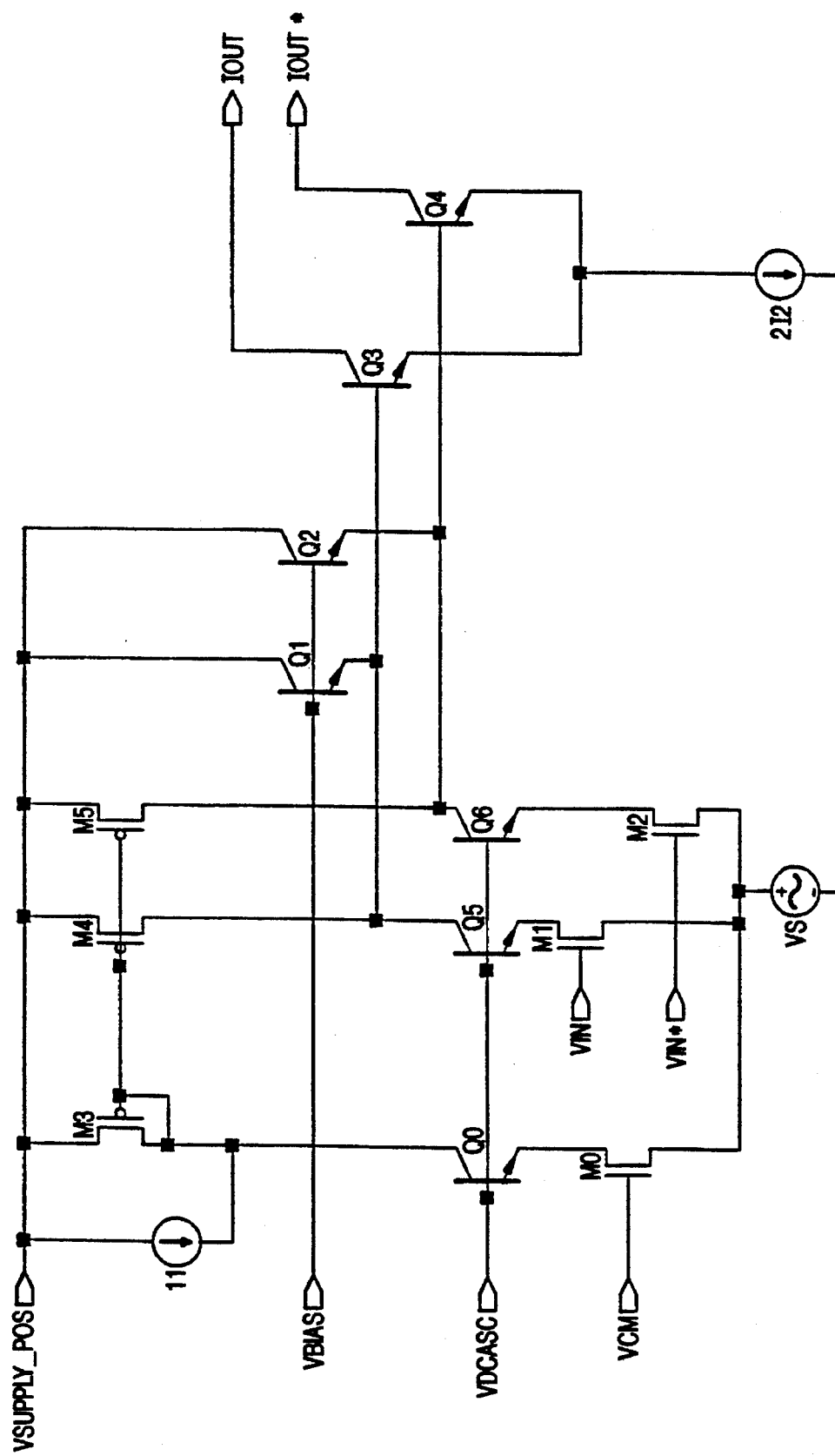
FIG. 9 is a circuit diagram for an embodiment of the present invention which, like the embodiment of FIG. 7, permits the $g_{md}$ of the MOSFET stage to be adjusted independently of the multiplier current gain.

FIG. 9 shows an embodiment of the present invention which, like the embodiment of FIG. 7, permits the $g_{md}$ of the MOSFET stage to be adjusted independently of the multiplier current gain (see the description of FIG. 7 regarding the addition of current source $I_1$ and the current mirror of MOSFETs M3, M4 and M5). The embodiment of FIG. 9 also includes the addition of cascode devices Q5 and Q6 to permit a smaller voltage at the drains of MOSFETs M1 and M2 (see the description of FIG. 8 regarding the decoupling provided by devices Q5 and Q6). Note that, if finite β is considered, the mirrored current $\alpha I_{DO} - I_1$ is precisely the DC current desired (Q0, Q5 and Q6 having the same β), and the more difficult problem noted in conjunction with the embodiment of FIG. 7 (where the desired current is $I_{OD} - I_1$) is avoided.

Figure 10:
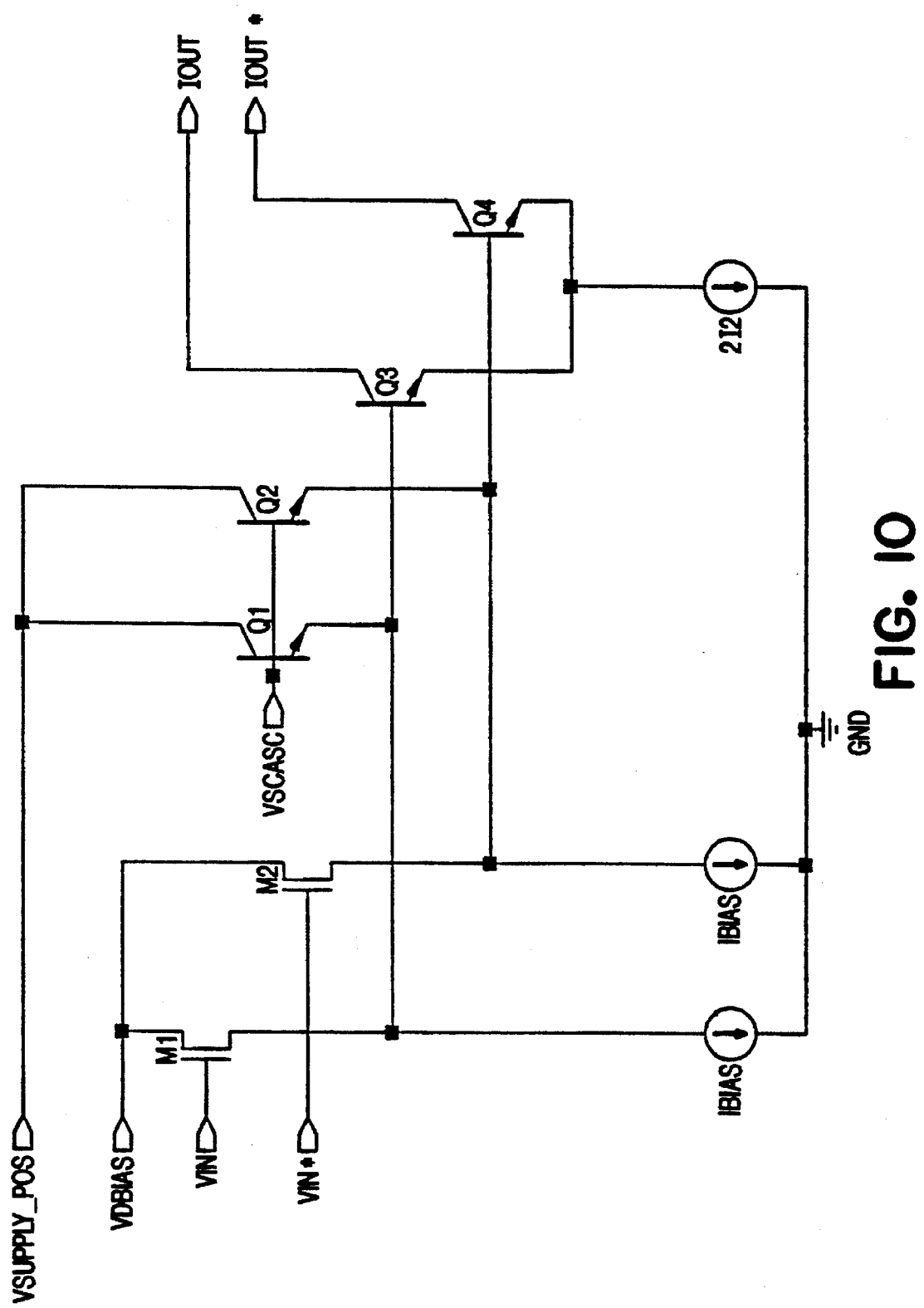
FIG. 10 is a circuit diagram for another embodiment of the present invention in which the sources (rather than the drains as in previous embodiments) of the input MOSFET devices are connected to the low impedance emitter nodes of the multiplier devices Q1, Q2, while the drain voltage of the input MOSFETs is set by another voltage source.

FIG. 10 shows another embodiment of the present invention in which the sources (rather than the drains as in previous embodiments) of the input MOSFET devices are connected to the low impedance emitter nodes of the multiplier devices Q1 and Q2, while the drain voltage of the input MOSFETs is set by another voltage source VDBIAS. Expressions for the overall $g_m$ of this embodiment may again be derived for the cases where the input MOSFETs operate in the triode region and in the saturation region; this task is facilitated by noting that the DC current in the emitters of Q1 and Q2 is now $I_{BIAS} - I_D$ rather than $I_D$ as in previous embodiments. For triode-region operation of the MOSFET input stage, it follows that:

$$g_m = \mu Cox \frac{W}{L} V_{DS} \frac{I_2}{I_{BIAS} - \mu Cox \frac{W}{L} \left( V_{CM} - V_S - V_T - \frac{V_{DS}}{2} \right) V_{DS}} \quad (15)$$

and for saturation-region operation:

$$g_m = \mu Cox \frac{W}{L} (V_{CM} - V_S - V_T) \frac{I_2}{I_{BIAS} - \frac{\mu Cox}{2} \frac{W}{L} (V_{CM} - V_S - V_T)^2} \quad (16)$$

Figure 11:
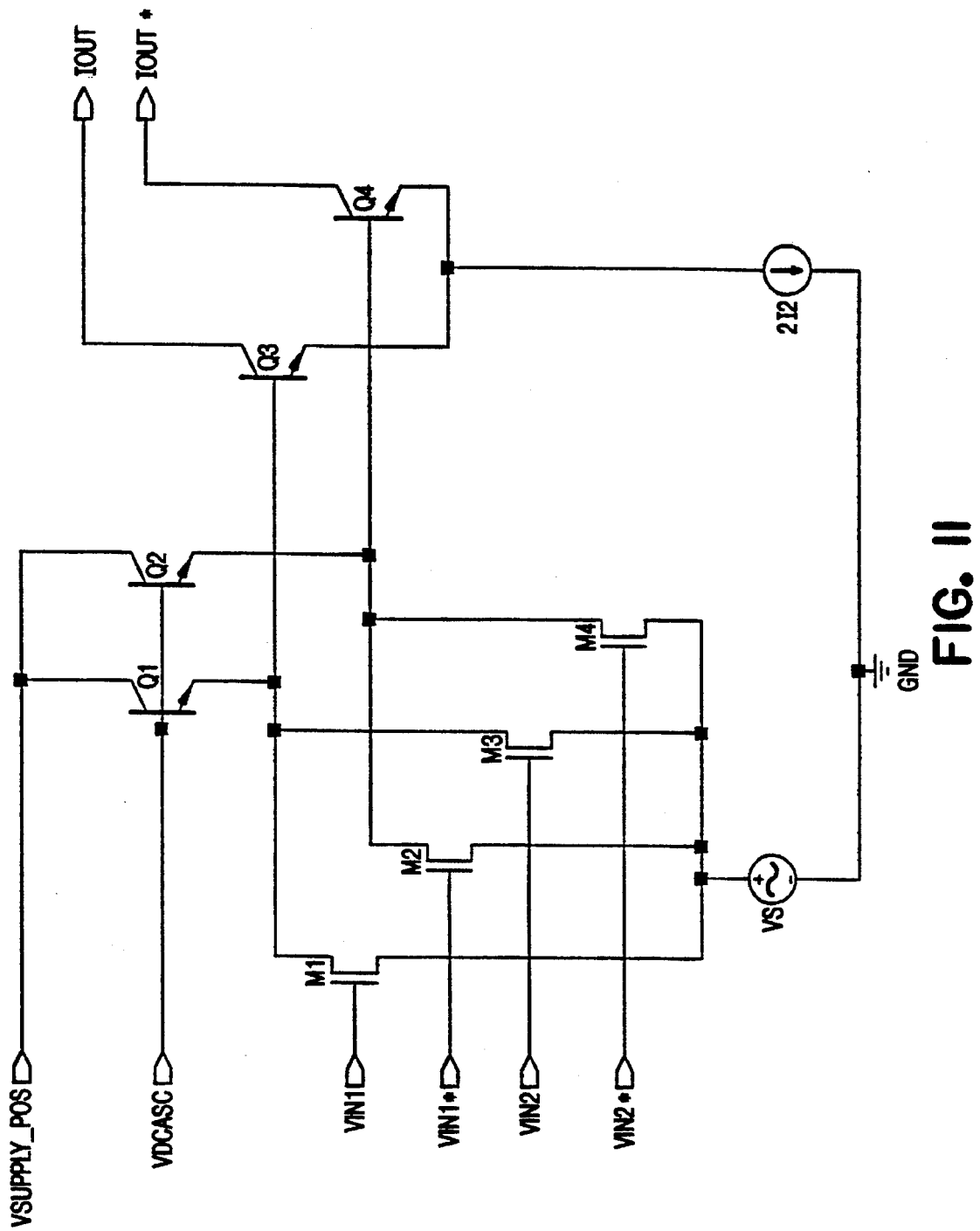
FIG. 11 is a circuit diagram for an embodiment of the present invention which is well suited for signal processing applications requiring the summing or differencing of multiple signals.

Signal processing applications often require the summing or differencing of multiple signals. FIG. 11 shows an embodiment of the present invention which is well suited to this task. This embodiment includes multiple input MOSFETs to accept multiple input voltage signals; the resulting currents in MOSFETs M1 and M3 and in MOSFETs M2 and M4 are then summed at the respective common drain connections and amplified by the multiplier. Similarly, a differencing operation can be performed by reversing the connections to the desired input signal. Note also that the sizes of MOSFETs M1 and M2 can be chosen differently than the sizes of MOSFETs M3 and M4, thus realizing a transfer function in the general form of a linear function of two input signals, $$I_{OUT} - I_{OUT^*} = [g_{md1}(V_{IN1} - V_{IN1^*}) + g_{md2}(V_{IN2} - V_{IN2^*})] \frac{I_2}{I_1} \quad (17)$$

where $g_{md1}$ is the transconductance of the MOSFET input stage formed by MOSFETs M1 and M2, and $g_{md2}$ is the transconductance of the MOSFET input stage formed by MOSFETs M3 and M4.

Figure 12:
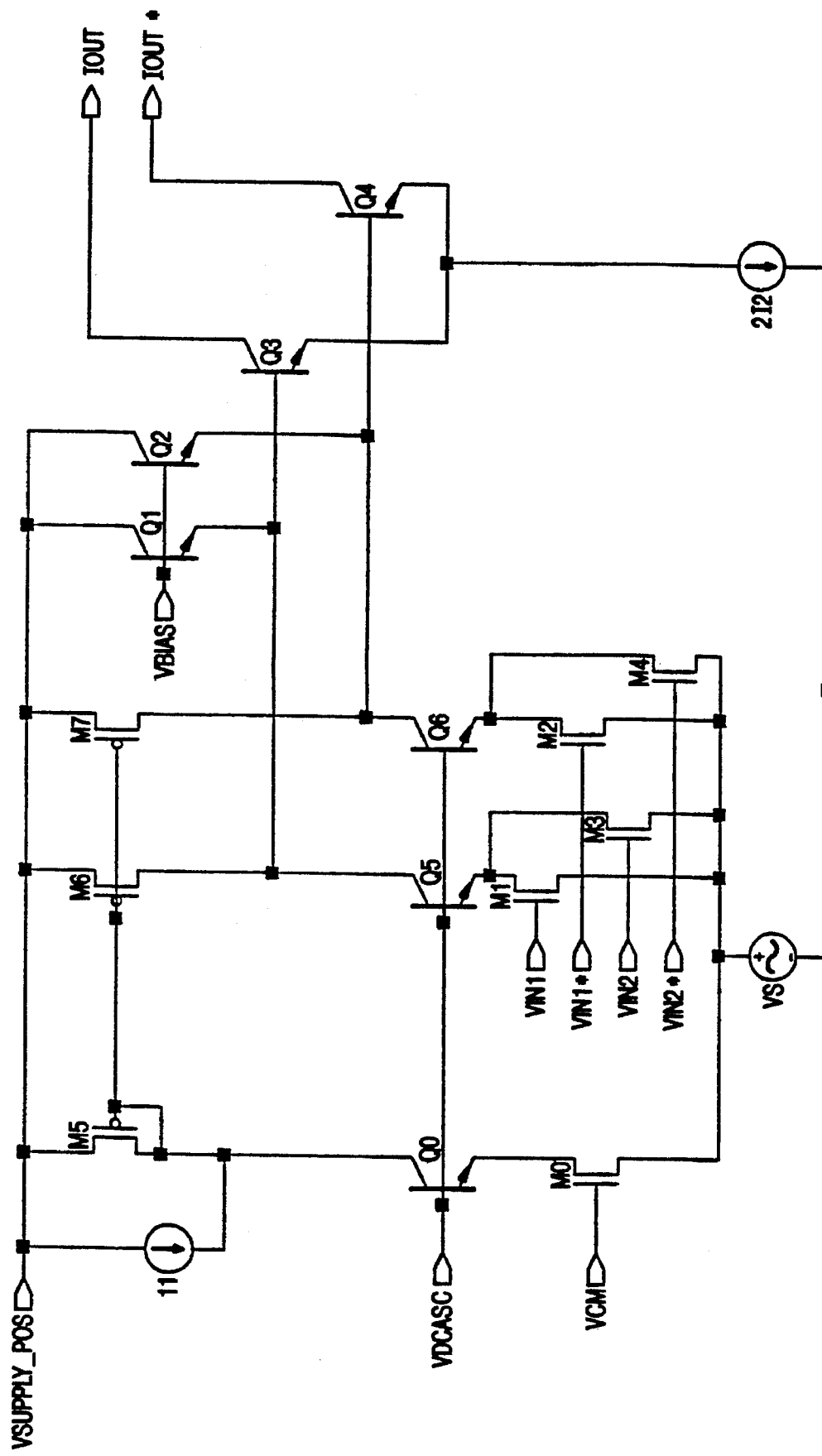
FIGS. 12 through 14 are circuit diagrams for additional multiple-input embodiments of the present invention based on the single-input embodiments of FIGS. 8 and 9.
Figure 13:
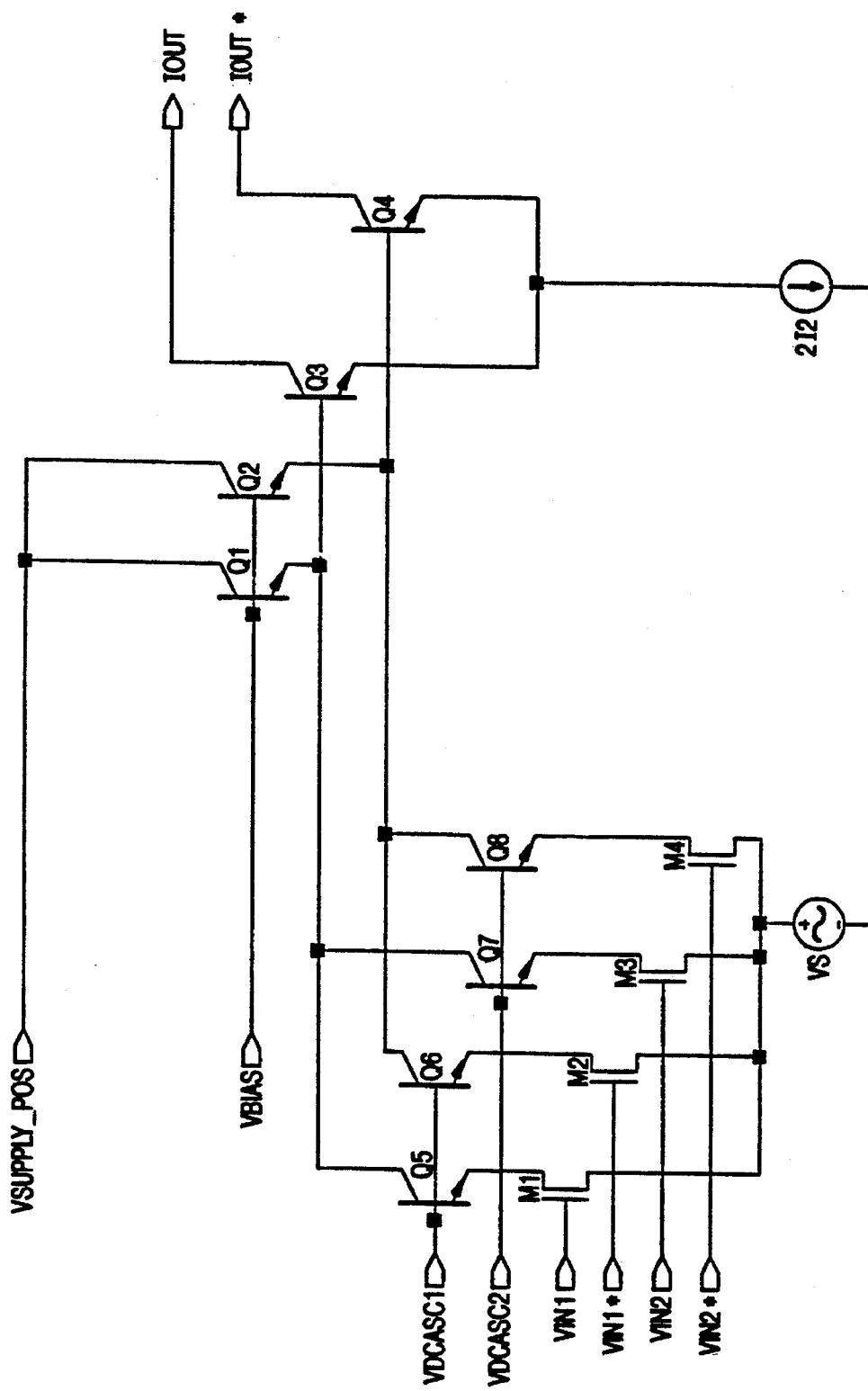
Figure 14:
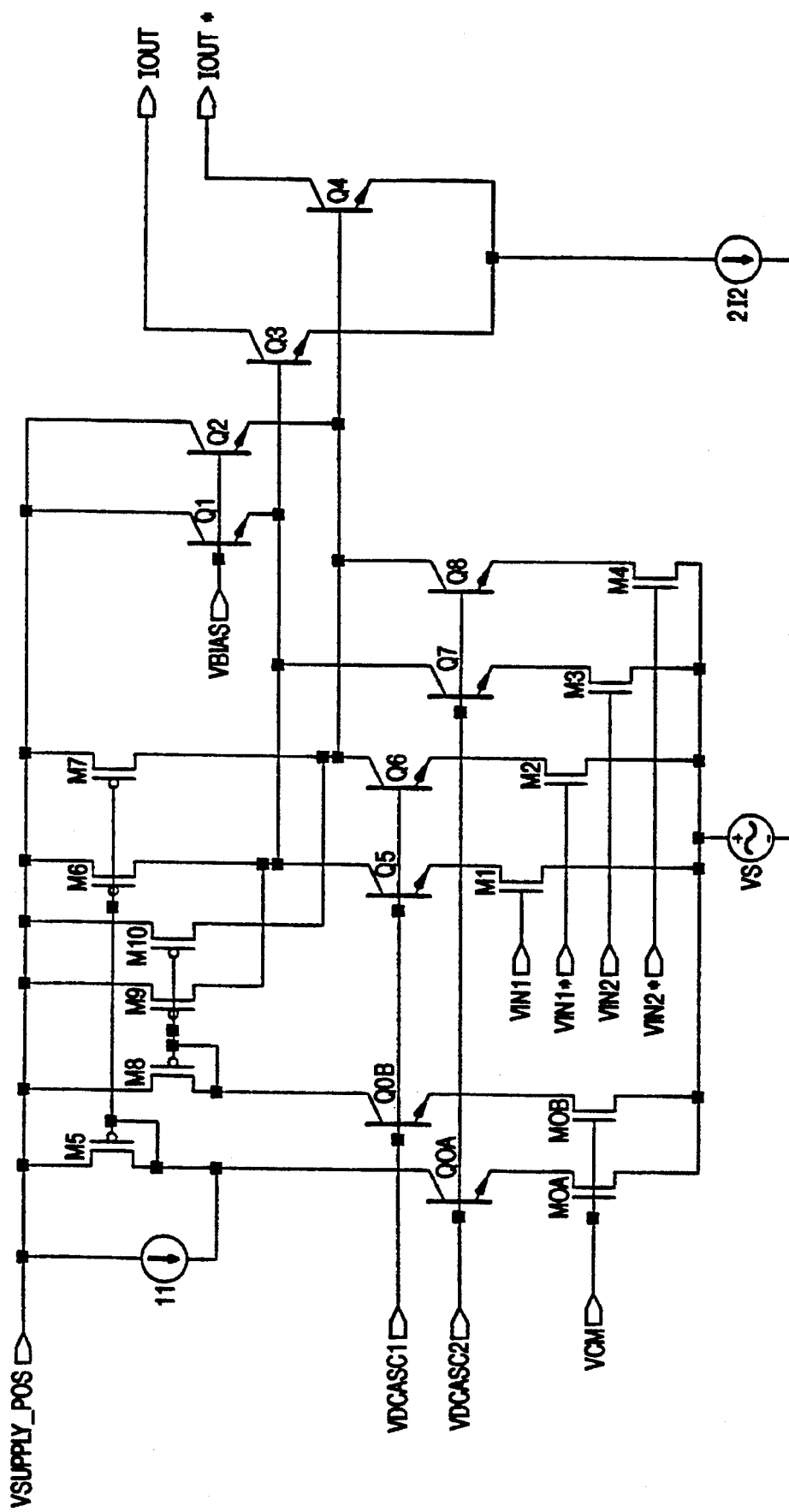

One skilled in the art will recognize that the other embodiments described previously can also be adapted to handle multiple inputs. For example, FIGS. 12 through 14 show additional multiple-input embodiments of the present invention based on the previously-described single-input embodiments of FIGS. 8 and 9. Note that in the embodiment of FIG. 12, either MOSFET M0 relative to MOSFETs M1 through M4, or current source I1, or the current mirror formed by MOSFETs M5 through M7 may require scaling of device sizes in order to set up the same DC currents in the multiplier devices Q1 and Q2 for this case as found in the corresponding single-input (single differential input pair) case of FIG. 9; i.e., the injected current must account for the DC drain current of the second input stage MOSFETs. Also note in the embodiments of FIG. 13 (in comparison to FIG. 8) and FIG. 14 (in comparison to FIG. 9) that the two transconductances $g_{md1}$ and $g_{md2}$ can be made unequal by choosing unequal VDCASC1 and VDCASC2.

In that regard, in FIG. 14, the current in device MOA minus the current $I_1$ is mirrored by device M5 to devices M6 and M7 and is injected into the drains of devices Q5 through Q8. The current in device MOB is mirrored by device M6 to devices M9 and M10 and is also injected into the drains of devices Q5 through Q8. Thus as in FIGS. 7 and 9, the additional component of current $I_1$ required by the two MOSFETs M1 and M3 is provided by transistor Q1, and the additional component of current $I_1$ required by the two MOSFETs M2 and M4 is provided by transistor Q2.

Figure 15:
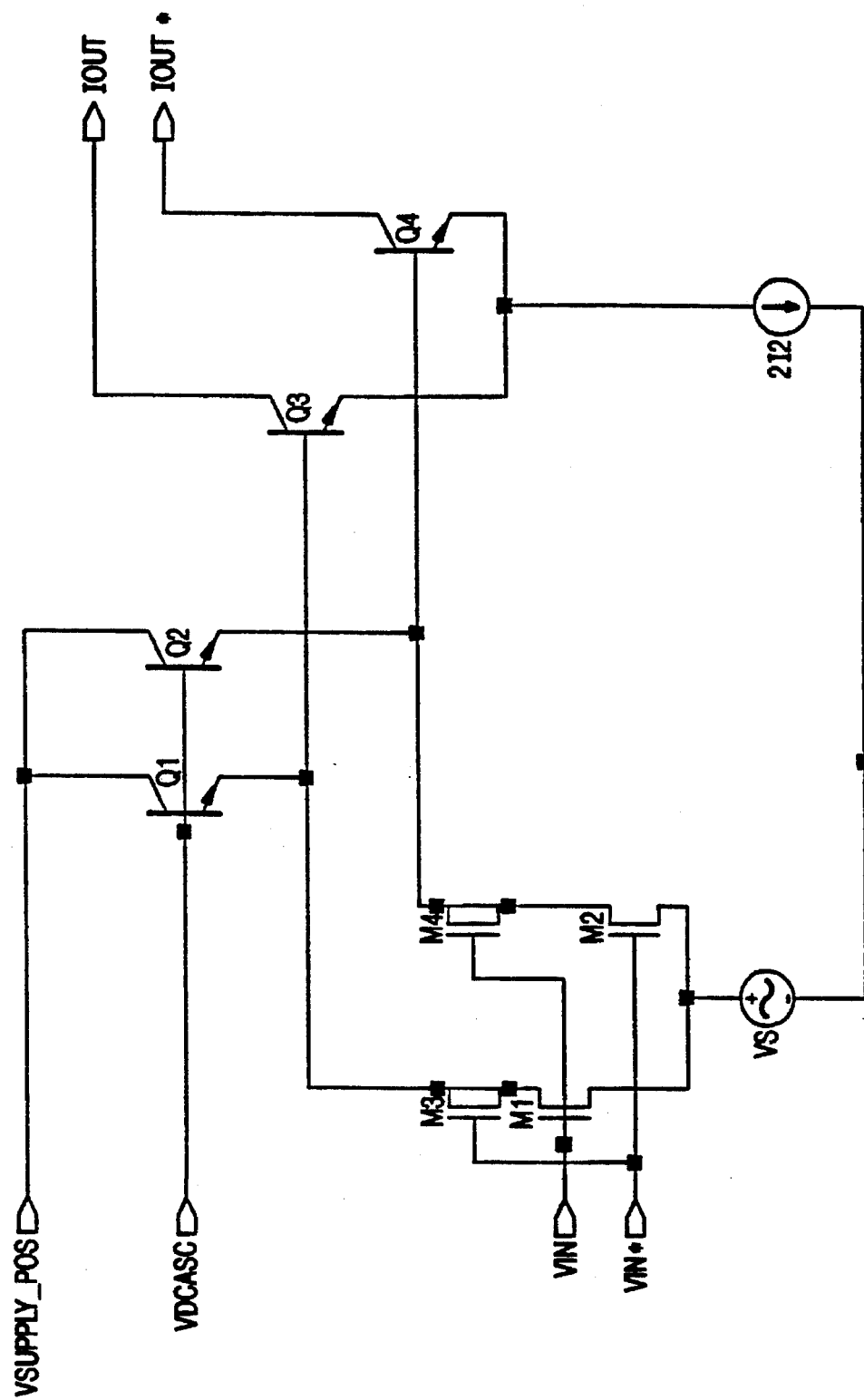
FIG. 15 is a circuit diagram for an embodiment of the present invention in which additional MOSFET devices have been added to partially compensate for parasitic high-frequency poles by introducing a high-frequency zero.

The useful high-frequency operating range of transconductance-amplifier-based systems is often limited by parasitic high-frequency poles in the transconductance amplifier itself. Such a parasitic pole exists, for example, in the embodiment of FIG. 6 due to the gate-to-drain capacitances of MOSFETs M1 and M2. FIG. 15 shows an embodiment of the present invention in which additional MOSFET devices M3 and M4 have been added to partially compensate for the parasitic high-frequency poles by introducing a high-frequency zero. One skilled in the art will recognize that similar frequency compensation techniques have been applied to numerous other MOSFET and BJT amplifier circuits and may be applied to other embodiments of the present invention.

Many applications of the transconductance amplifier require an output resistance somewhat higher than can be obtained with the single BJT output device shown in the previous embodiments of FIGS. 6 through 15. One skilled in the art will recognize that additional devices can easily be added at the output of these embodiments to obtain an acceptably high output resistance. For example, FIG. 16 shows an embodiment of the present invention in which BJT cascode devices Q5 and Q6 and cascode current source loads ML1, ML1C and ML1*, ML1C* have been added to obtain a high output resistance.

Figure 16:
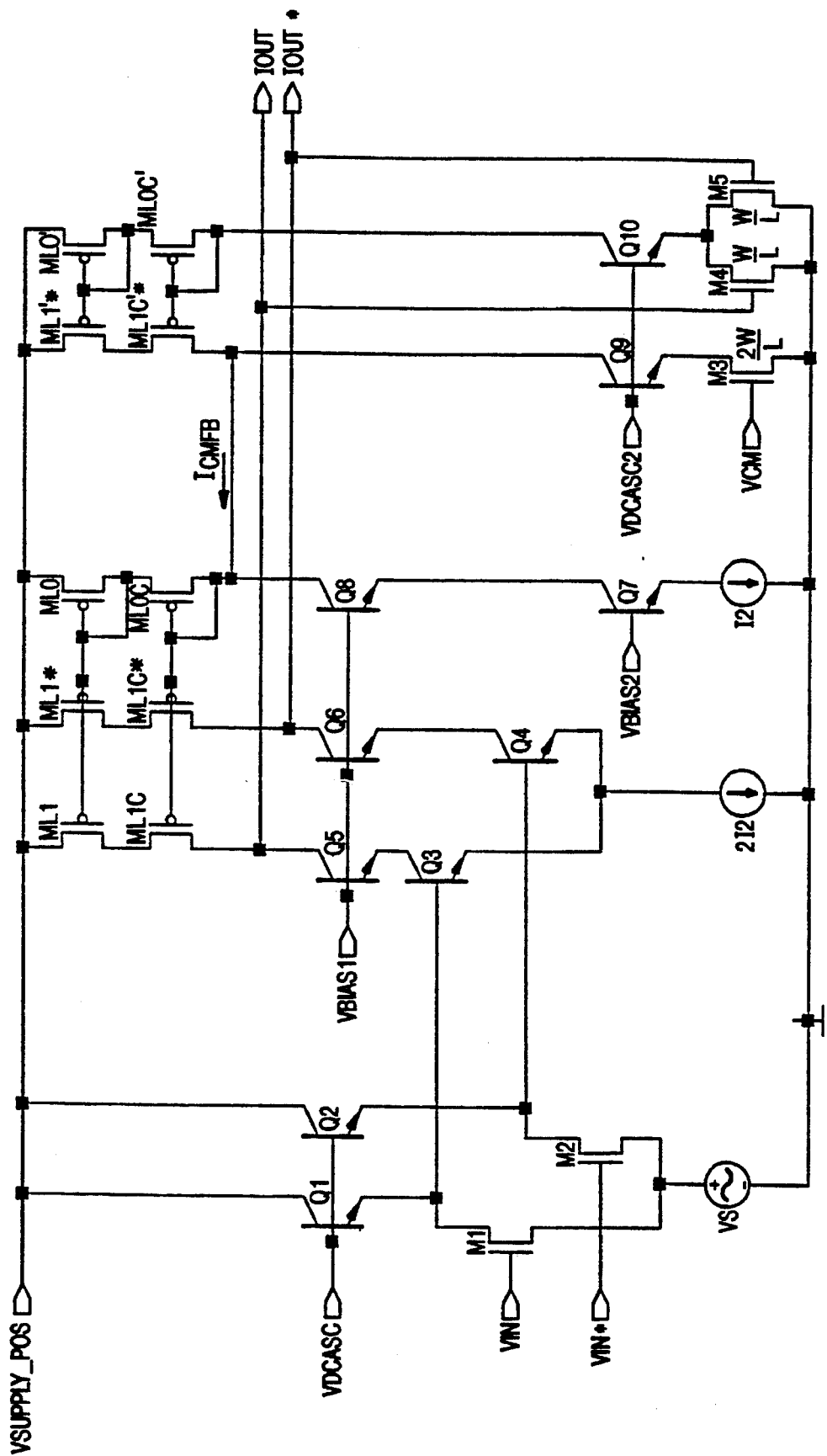
FIG. 16 is a circuit diagram of an embodiment of the present invention in which BJT cascode devices and cascode current source loads have been added to obtain a high output resistance, and a common-mode feedback circuit has been added to control the common-mode output voltage of the transconductance amplifier.

Also included in FIG. 16 is a common-mode feedback circuit consisting of MOSFETs M3 through M5, ML1, ML1C, ML1*, ML1C*, ML0, ML0C, ML1'*, ML1C'*, ML0', ML0C' and BJTs Q7 through Q10; such feedback circuits are often necessary to control the common-mode output voltage of the transconductance amplifier. Devices Q7 and Q8 generate the DC current $\alpha^2 I_2$ expected in the collectors of multiplier output cascode devices Q5 and Q6. If the common-mode output voltage at IOUT, IOUT* exceeds the desired value VCM, then the sum of the drain currents of triode-region-biased MOSFETs M4 and M5 will exceed that of MOSFET M3 (note the device sizing for MOSFETs M3, M4 and M5 shown in the FIG. 16). This current through device Q10 will be mirrored by devices ML0' and ML0C' to devices ML1'* and ML1C'*. The difference between this mirrored current and the current through devices M3 and Q9 is the positive common mode feedback current ICMFB which will reduce the current in the current-source loads and thus reduce the common-mode output voltage at IOUT, IOUT*. Similarly, if the common-mode voltage at IOUT, IOUT* is less than the desired value VCM, then the resulting negative ICMFB will act to increase the common-mode output voltage. One skilled in the art will recognize that there exist a number of alternative implementations of common-mode feedback circuits.

Figure 17:
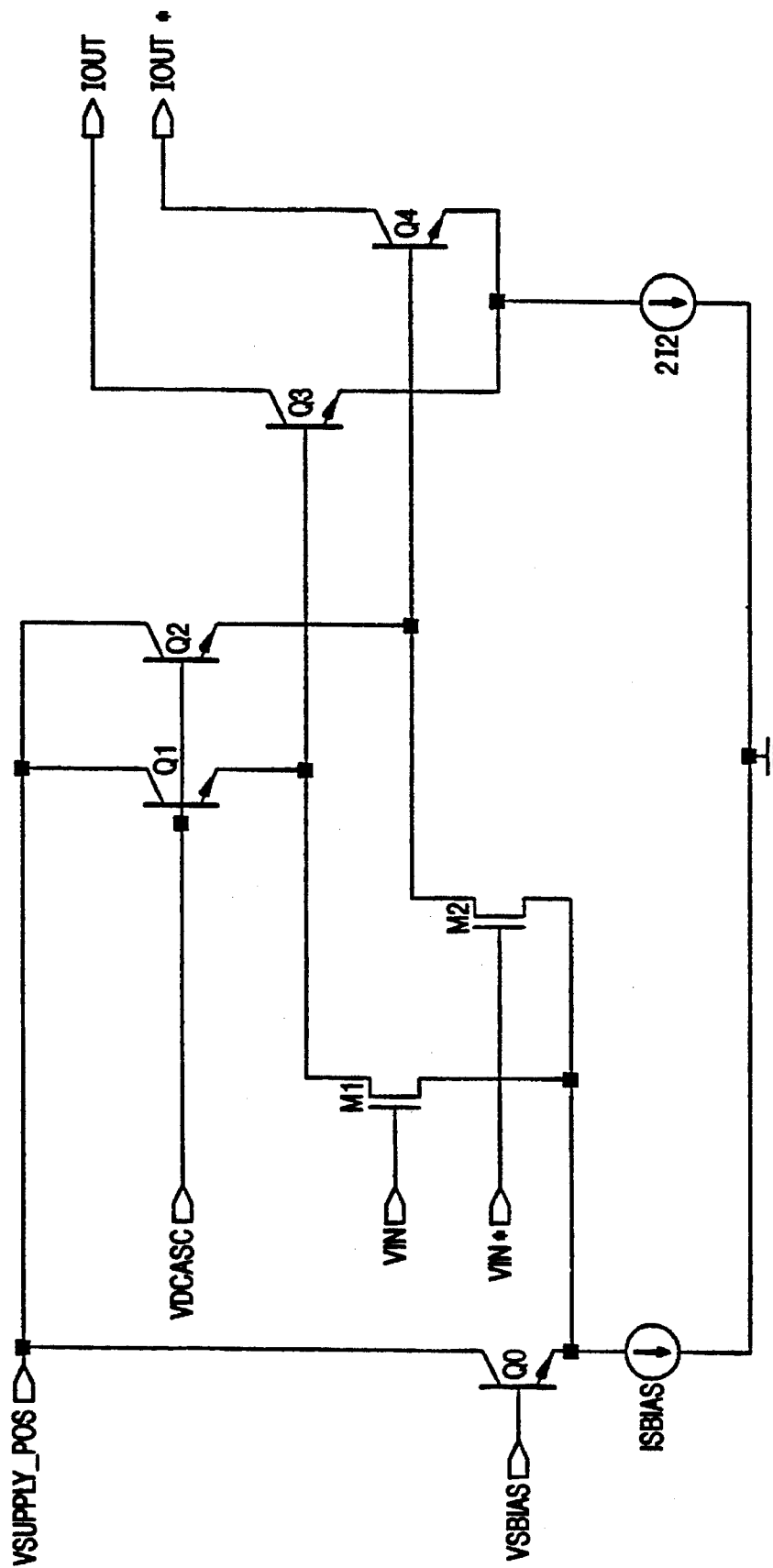
FIG. 17 is a circuit diagram for an embodiment of the present invention in which an emitter follower is used to set the source voltage of the input MOSFET devices.
Figure 18:
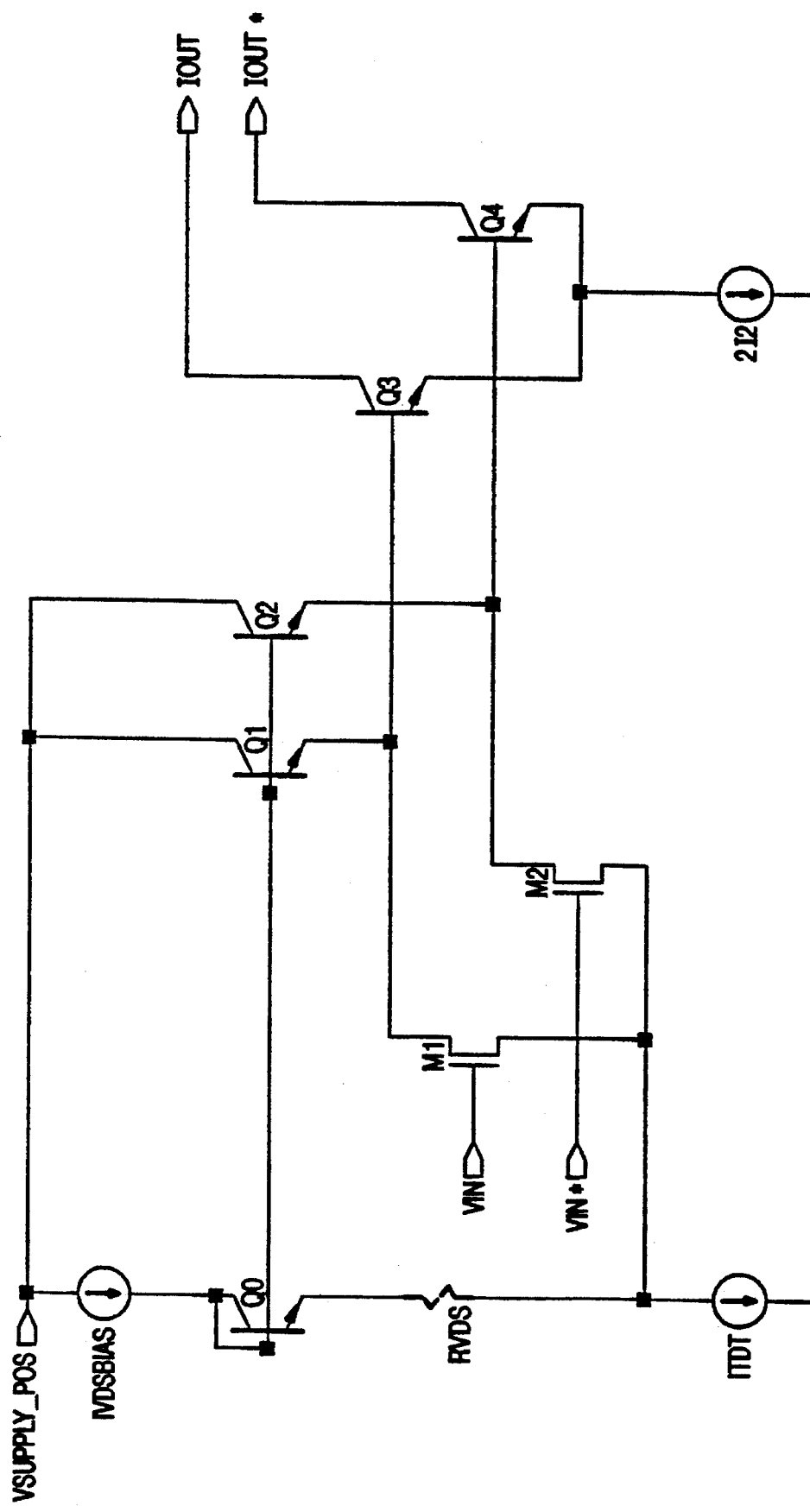
FIGS. 18 and 19 are circuit diagrams showing the addition of one or more resistive elements such that a voltage drop forced across one resistor approximately matches the drain-to-source voltage drop across the MOSFET input devices.
Figure 19:
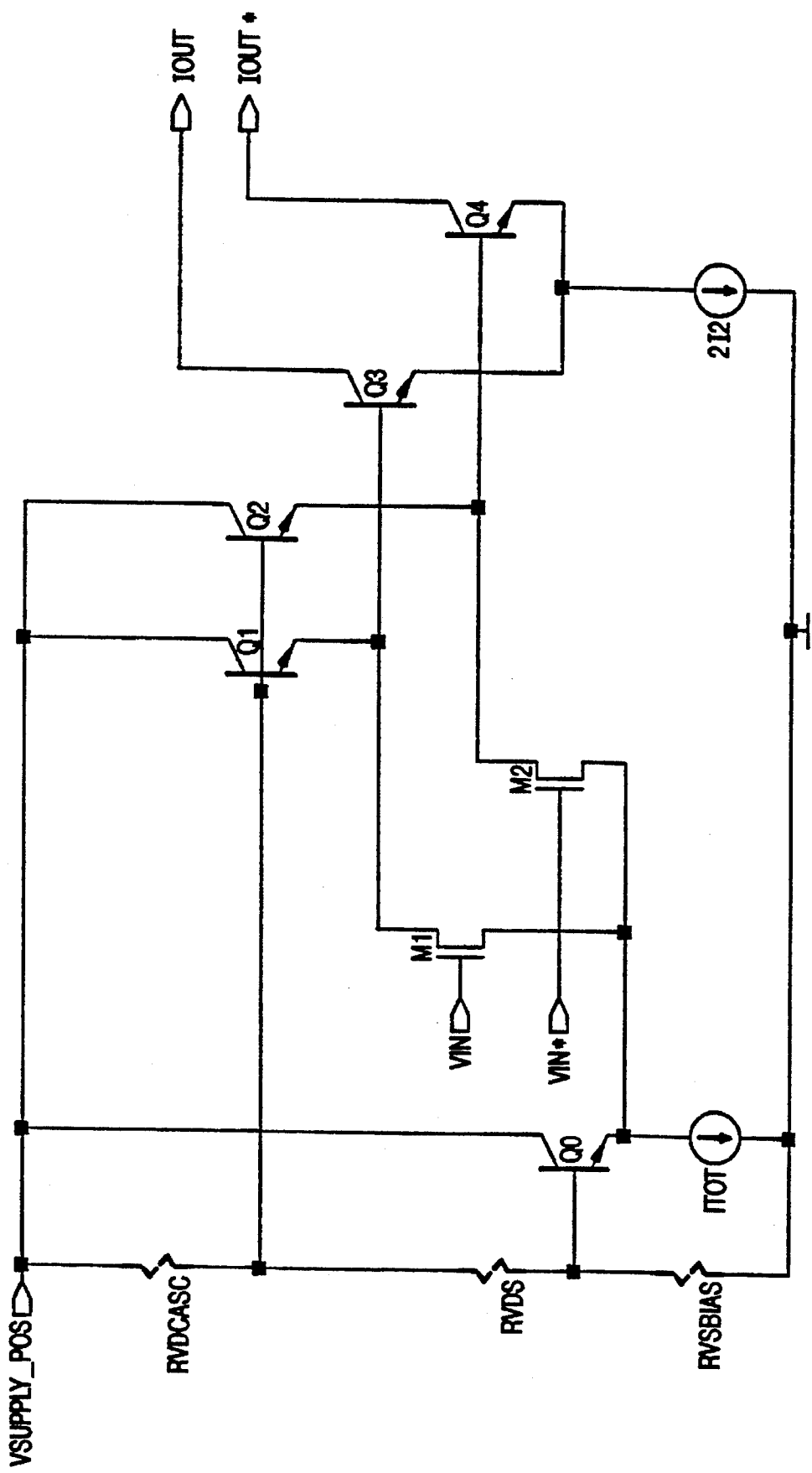

One skilled in the art will also recognize that there exist a number of ways to realize the desired voltages at the drains and/or sources of the input stage MOSFET devices of the present invention. For example, low output impedance voltage amplifiers may be used; FIG. 17 shows an embodiment of the present invention in which an emitter follower is used to set the source voltage of the input MOSFET devices M1 and M2. Also, one or more resistive elements may be included such that a voltage drop forced across one resistor approximately matches the drain-to-source voltage drop across the MOSFET input devices; the embodiments of FIGS. 18 and 19 are examples of this approach. In embodiments such as that shown in FIG. 6 (i.e., with low-impedance voltage sources biasing the sources of the input MOS devices), the sources of the NMOS input stage FETs may also be tied directly to the most negative power supply level (e.g., VS=0 in the embodiment of FIG. 6), while in embodiments such as that shown in FIG. 10 the drains of the NMOS input stage FETs may be tied directly to the most positive power supply level (e.g., VDBIAS=VSUPPLY_POS in the embodiment of FIG. 10).

Figure 20:
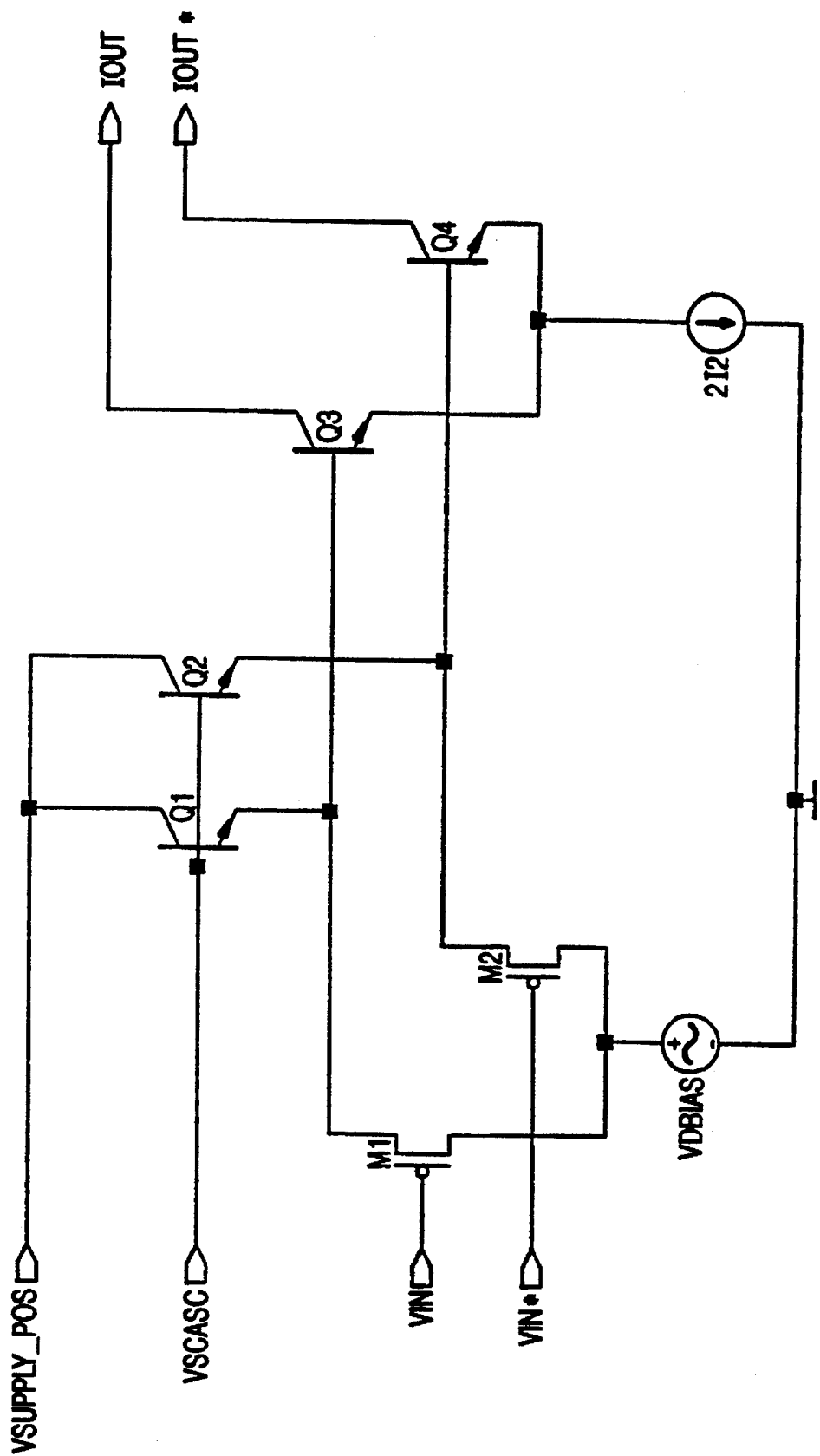
FIGS. 20 and 21 are circuit diagrams of two embodiments of the invention in which p-channel MOSFETs are used as the input stage devices instead of the n-channel MOSFETs of the previous embodiments.
Figure 21:
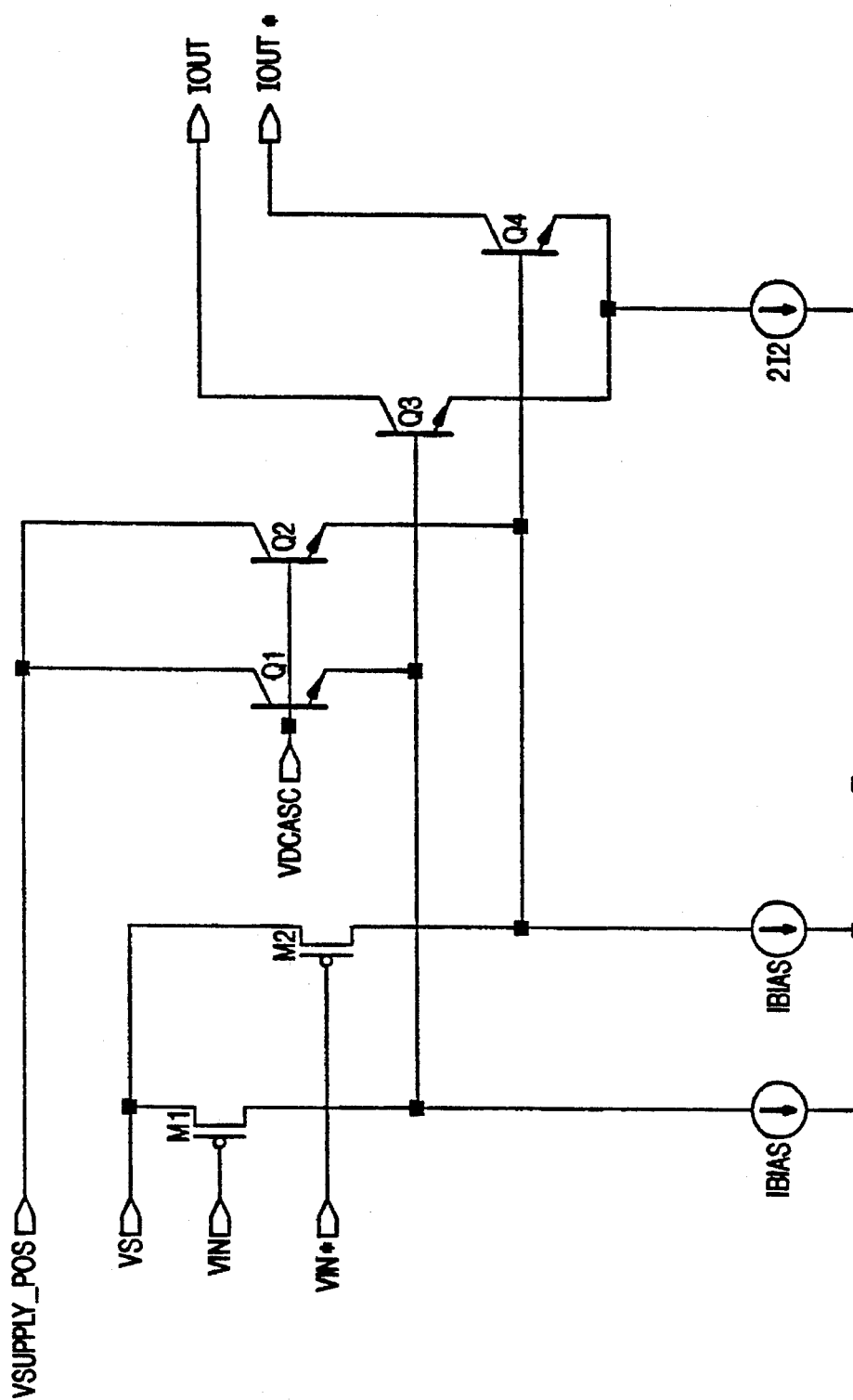
Figure 22:
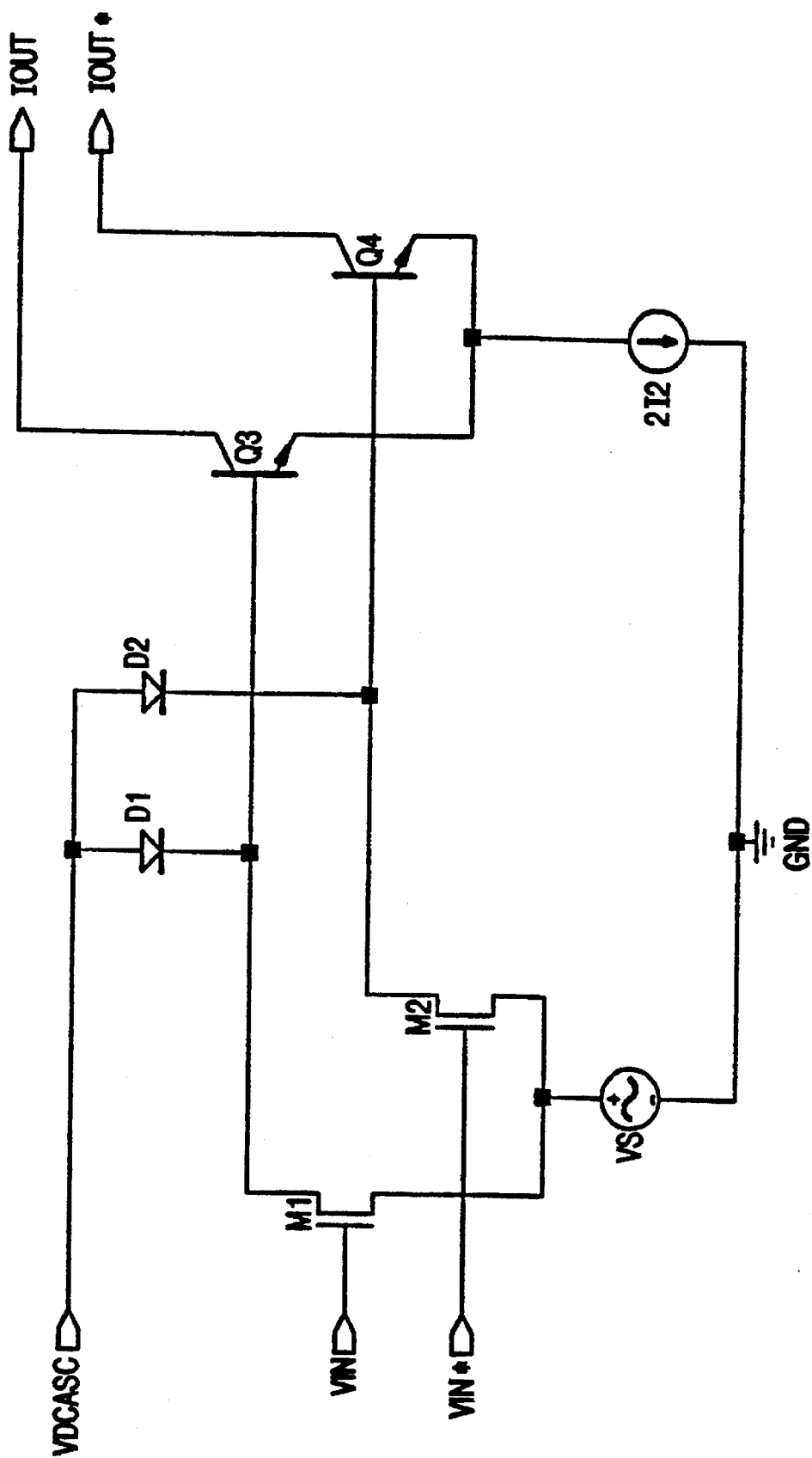
FIG. 22 is a circuit diagram for an embodiment in which diodes have been substituted for two of the multiplier transistors.
Figure 23:
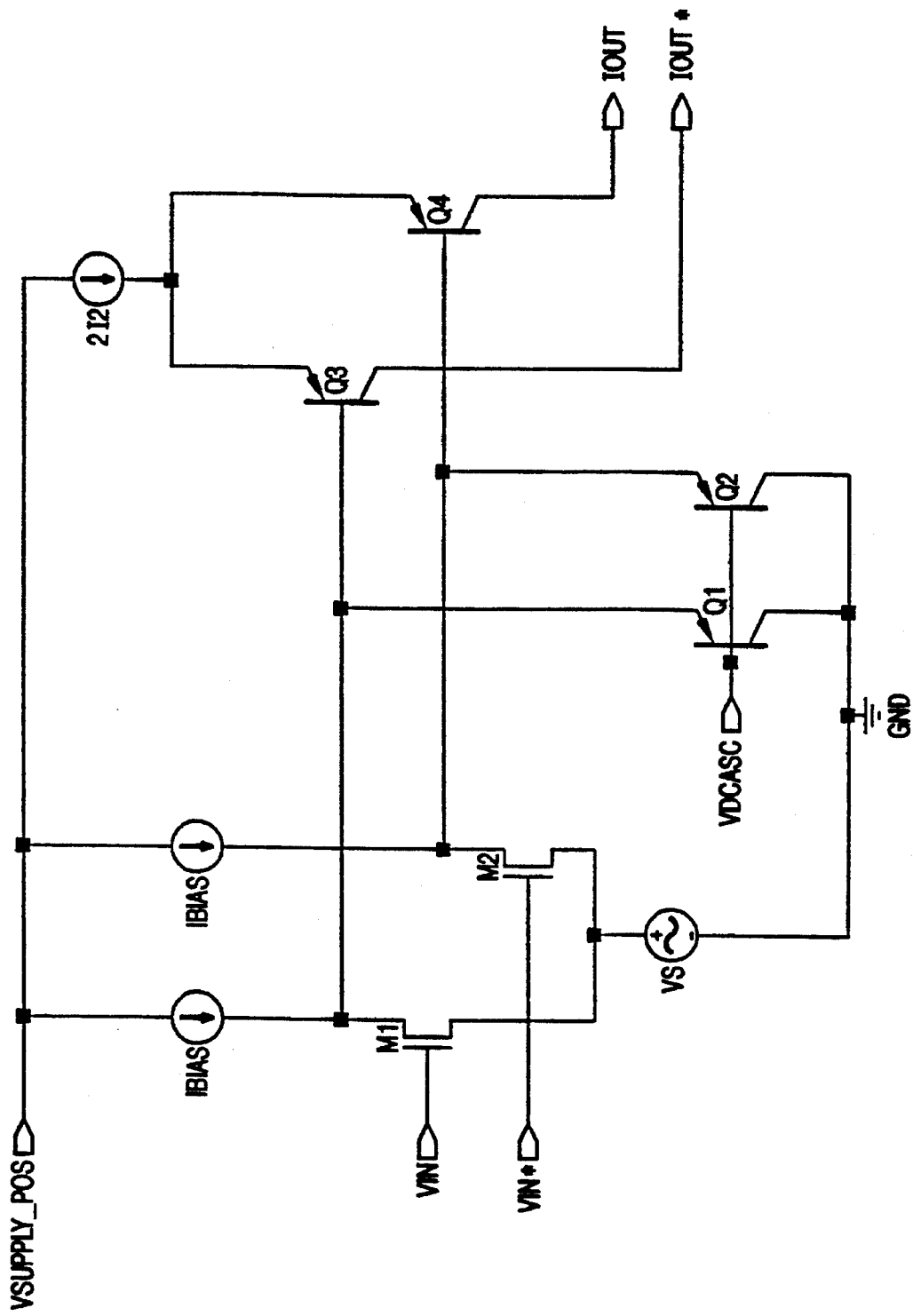
FIG. 23 is a circuit diagram of an embodiment of the present invention in which the multiplier stage is implemented with pnp BJTs rather than npn BJTs.

One skilled in the art will also recognize that while the embodiments of FIGS. 6 through 19 assume n-channel MOSFETs, the present invention may also be implemented with other FET types (e.g., p-channel MOSFETs or p- or n-channel JFETs) as the input stage devices; FIGS. 20 and 21 show two such embodiments in which p-channel MOSFETs M1 and M2 are used as the input stage devices. The multiplier stage may also be implemented in a number of ways. For example, as shown in the embodiment of FIG. 22, diodes D1 and D2 (or diode connected transistors) may be substituted for two of the multiplier transistors. Also, the multiplier stage may be implemented with pnp BJTs rather than npn BJT's; FIG. 23 shows one such embodiment of the present invention.

Figure 24:
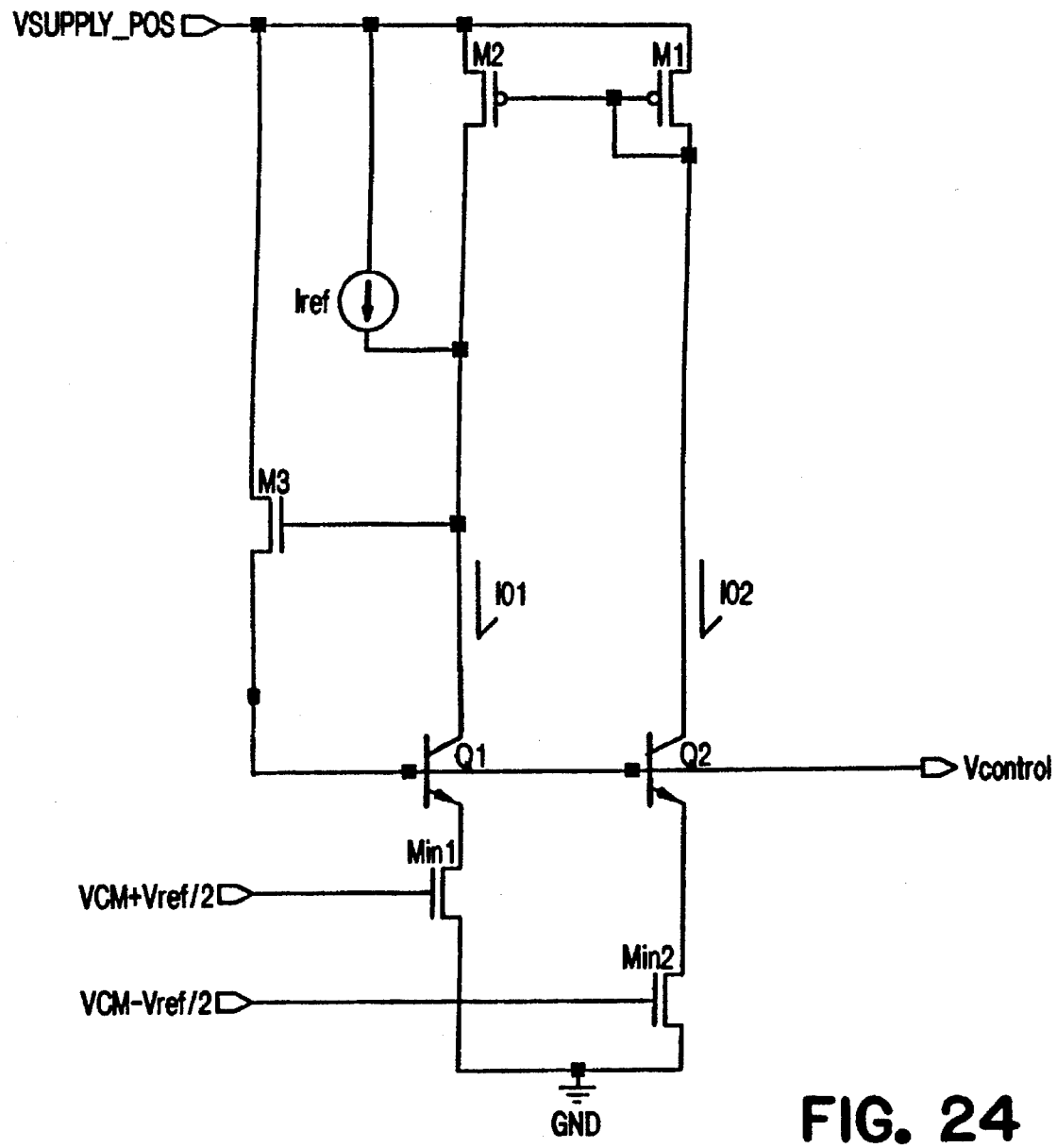
FIG. 24 is a generalized diagram of one embodiment of the transconductance control circuit of the present invention.

FIG. 24 is a circuit diagram of one embodiment of the transconductance control circuit of the present invention. MOSFETs Min1 and Min2 together with BJT's Q1 and Q2 comprise a differential transconductor, where the transconductance value is controlled via voltage $V_{control}$ (this control voltage is also made available to any identical signal processing transconductors in the primary system). Application of a differential reference voltage $V_{ref}$ to the gates of Min1 and Min2 gives rise to a differential output current $$I_{o1} - I_{o2} = g_{mcontrol} * V_{ref} \quad (18)$$

Assuming the current mirror formed by M1 and M2 is ideal and noting that no DC current flows into the gate of MOSFET M3, it follows that $$I_{o1} = I_{o2} + I_{ref} \quad (19)$$

and that the differential output current is equal to the applied reference current $$I_{o1} - I_{o2} = I_{ref} \quad (20)$$

Equating (18) and (20) leads to the desired result $$g_{mcontrol} = V_{ref} / I_{ref} \quad (21)$$

MOSFET M3 acts as a voltage buffer to close the feedback loop which maintains (21) over varying conditions. For example, should a temperature change tend to increase the $g_m$ of the control transconductor for a given value of $V_{control}$, the resulting increase in the collector current of Q1 will cause a decrease in the output resistance of Q1 and thus a decrease in the voltage at the collector of Q1 and at the gate of M3. This decrease in the gate voltage of M3 will lead to a decrease in the source voltage of M3, i.e., a decrease in the voltage $V_{control}$. Thus, factors which would normally tend to vary the control transconductance value $g_{mcontrol}$ will, because of the feedback loop, also tend to vary the control voltage $V_{control}$ in the opposite sense such that the value of $g_{mcontrol}$ continues to satisfy (21).

Figure 1:
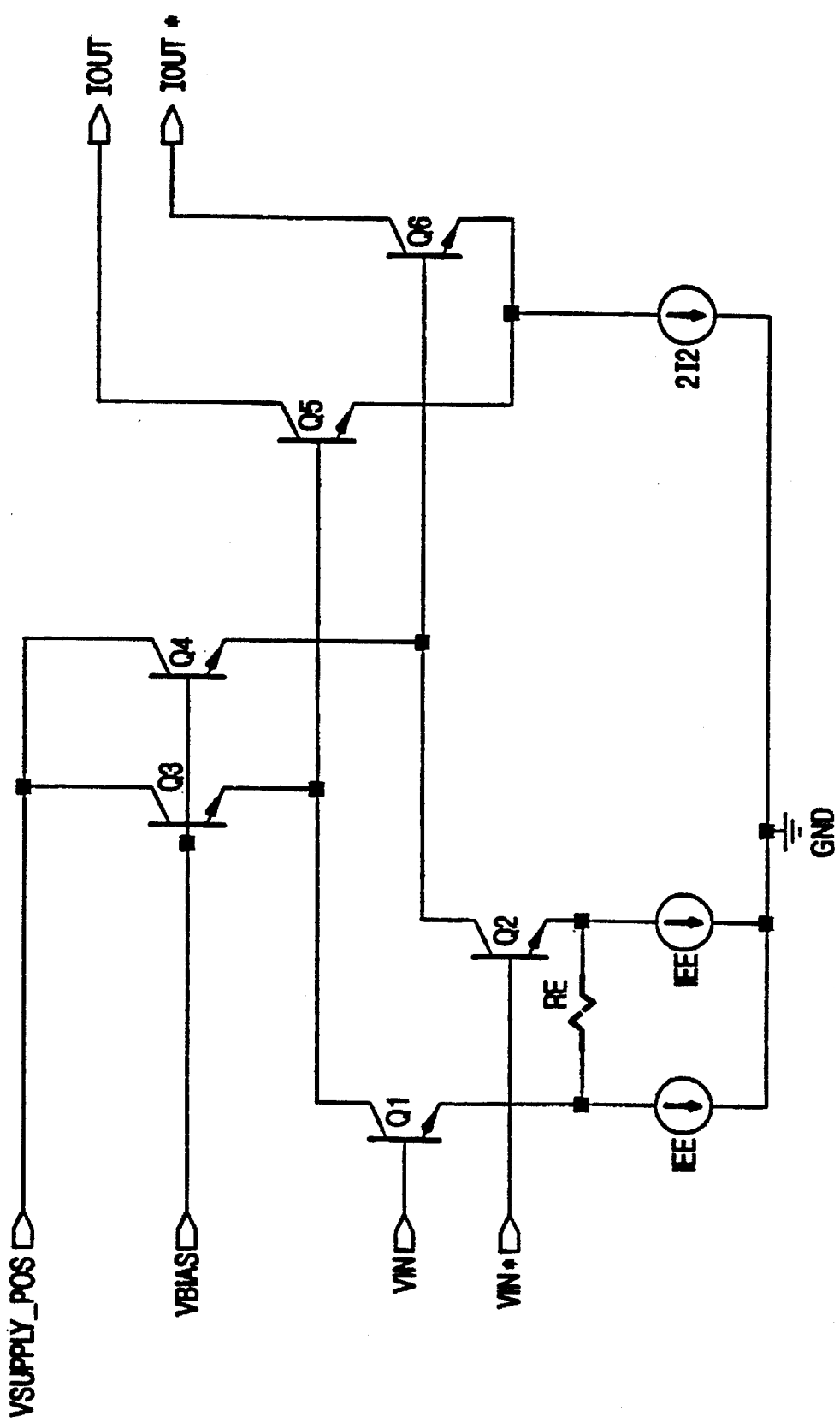
FIG. 1 is a circuit diagram of a prior art bipolar transconductance amplifier based on the Gilbert multiplier.
Figure 2:
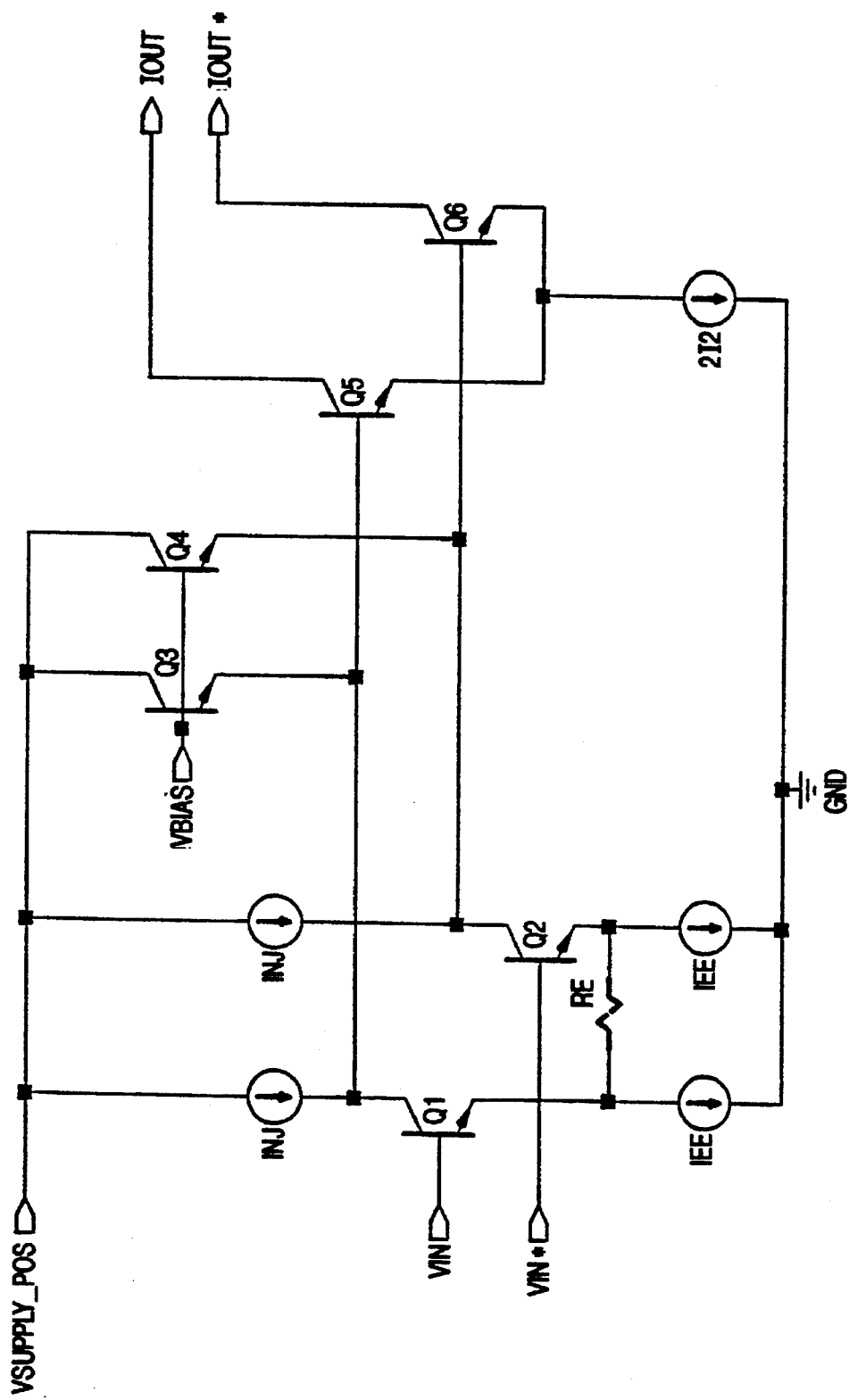
FIG. 2 is a schematic diagram of the prior art bipolar transconductance amplifier of FIG. 1 having an additional means of $g_m$ adjustment by injecting a control current.
Figure 3:
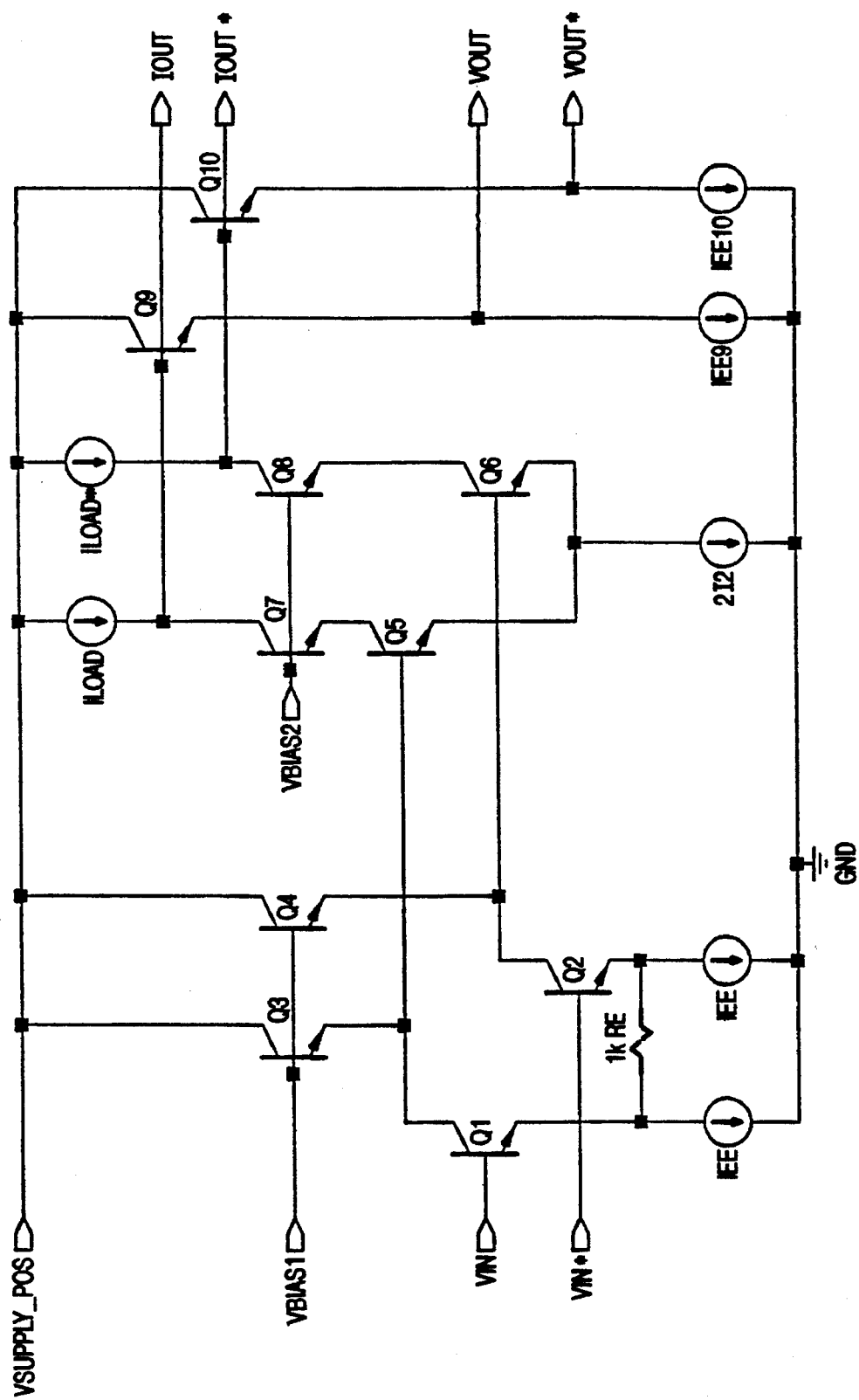
FIG. 3 is a circuit diagram for a more complete version of the prior art transconductance amplifier of FIG. 1.
Figure 4:
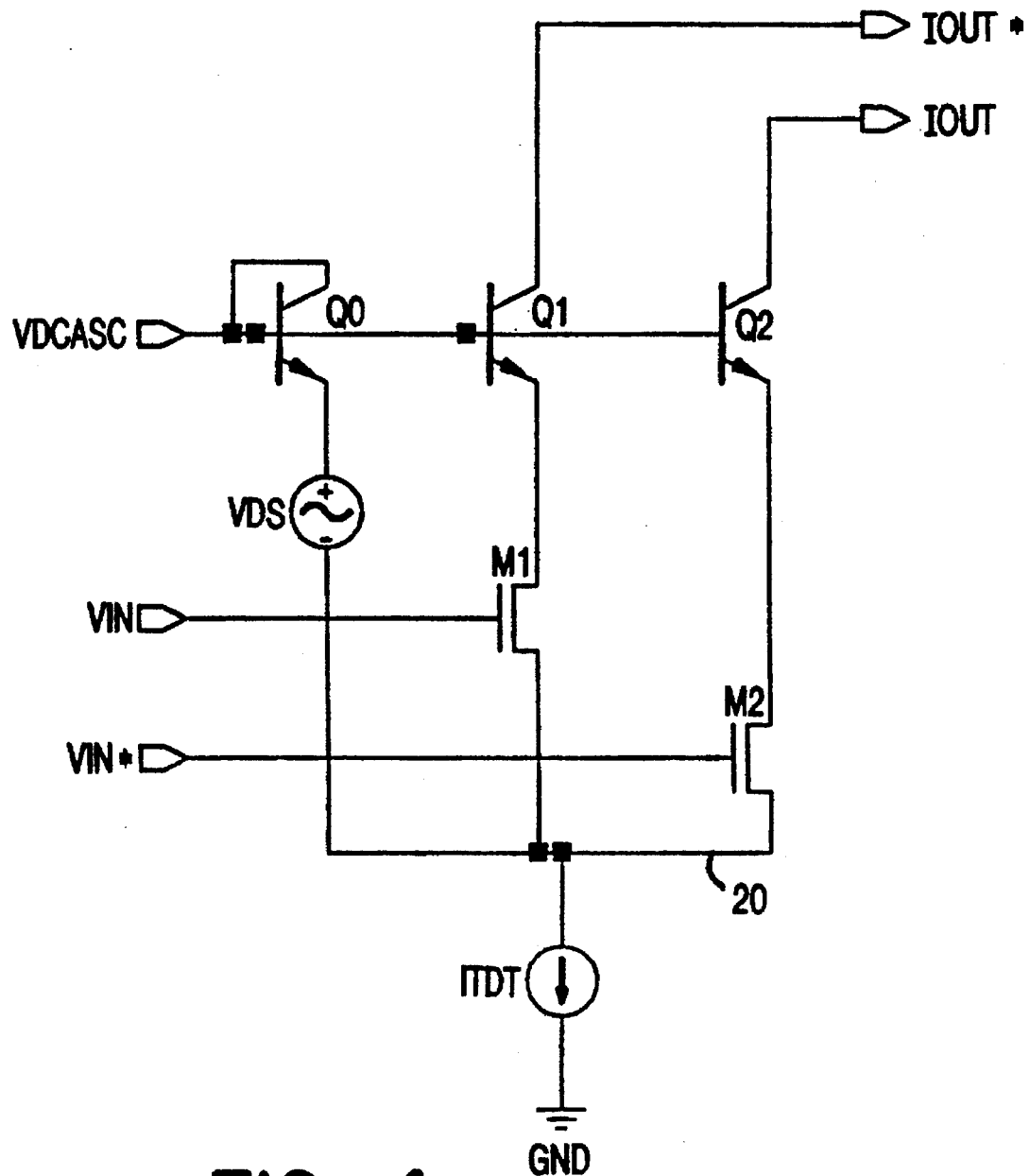
FIG. 4 is a circuit diagram of a prior art BiMOS transconductance amplifier in which the input devices are MOSFETs biased in the triode region of operation.
Figure 5:
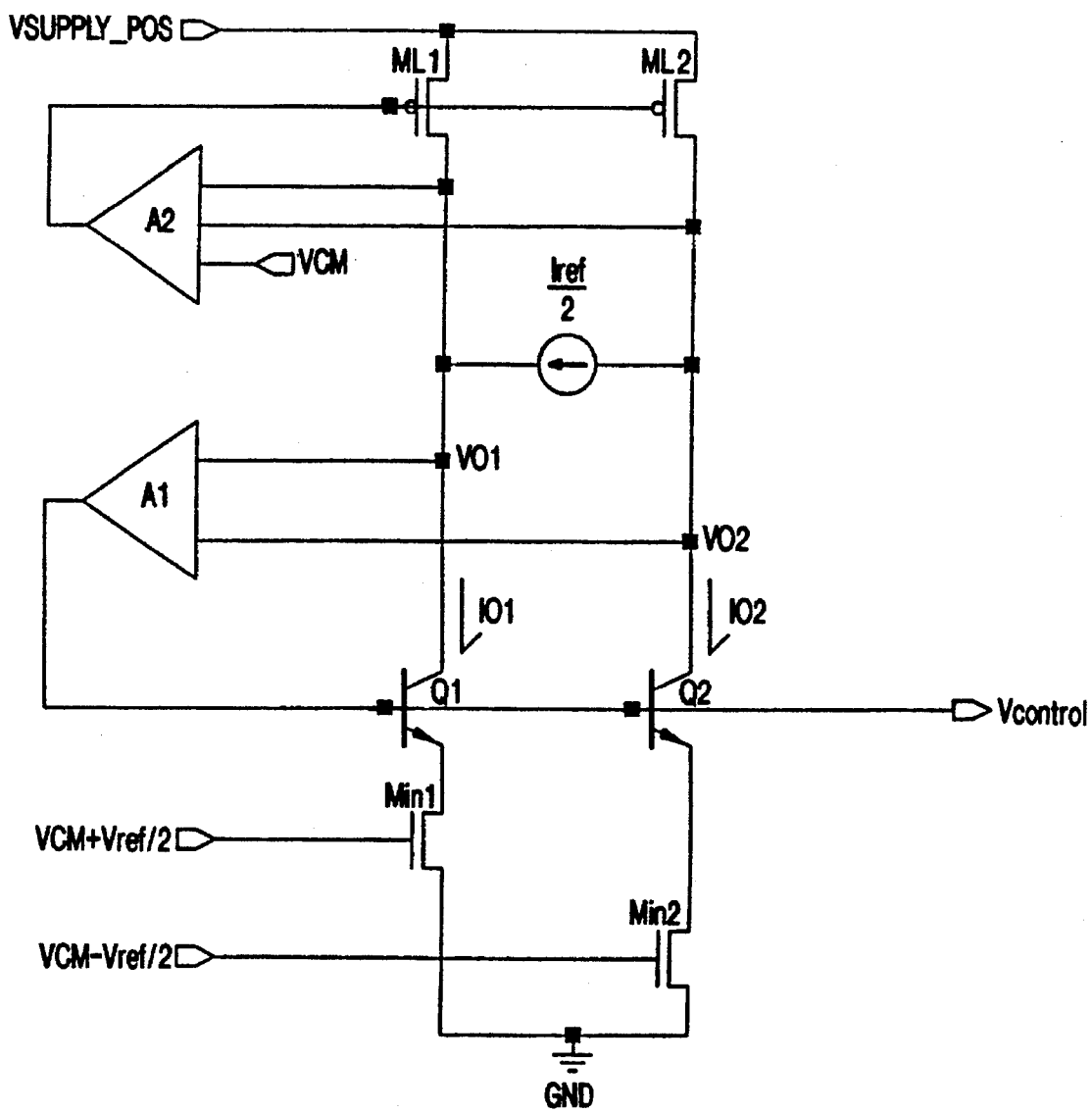
FIG. 5 is a circuit diagram of a prior art $g_m$ control circuit.
Figure 25:
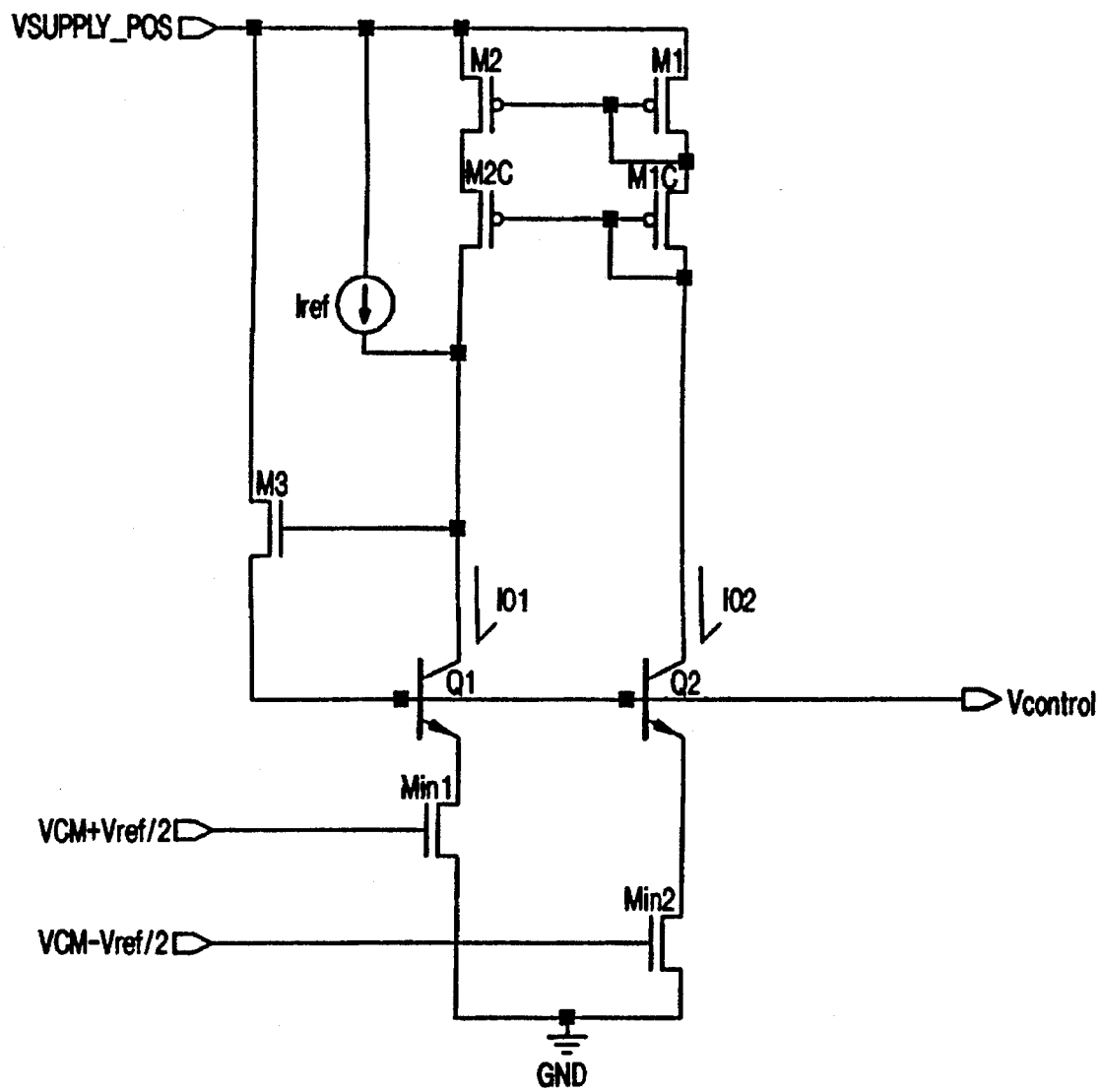
FIG. 25 is a circuit diagram of one embodiment of the transconductance control circuit of the present invention.

The advantage of the present invention over the prior art circuit of FIG. 5 is that the present invention requires only a simple one-transistor voltage buffer (M3) in the feedback loop rather than the two more complex voltage amplifiers required by the prior art circuit. However, it should be noted that the accuracy of this $g_m$ control technique will depend on the high output impedance of the transconductor since, unlike the prior art circuit of FIG. 5, the present invention may operate with a significant voltage difference between the output nodes; a sufficiently high output impedance will make the output currents $I_{o1}$ and $I02$ immune to such a voltage difference. It should be obvious that the accuracy of the present invention also depends on the accuracy of the current mirror formed by MOSFETs M1 and M2; for this reason, the simple current mirror may be replaced with a more complex mirror (e.g., a cascode mirror) which exhibits a superior current transfer accuracy, as shown in the embodiment of FIG. 25.

Figure 26:
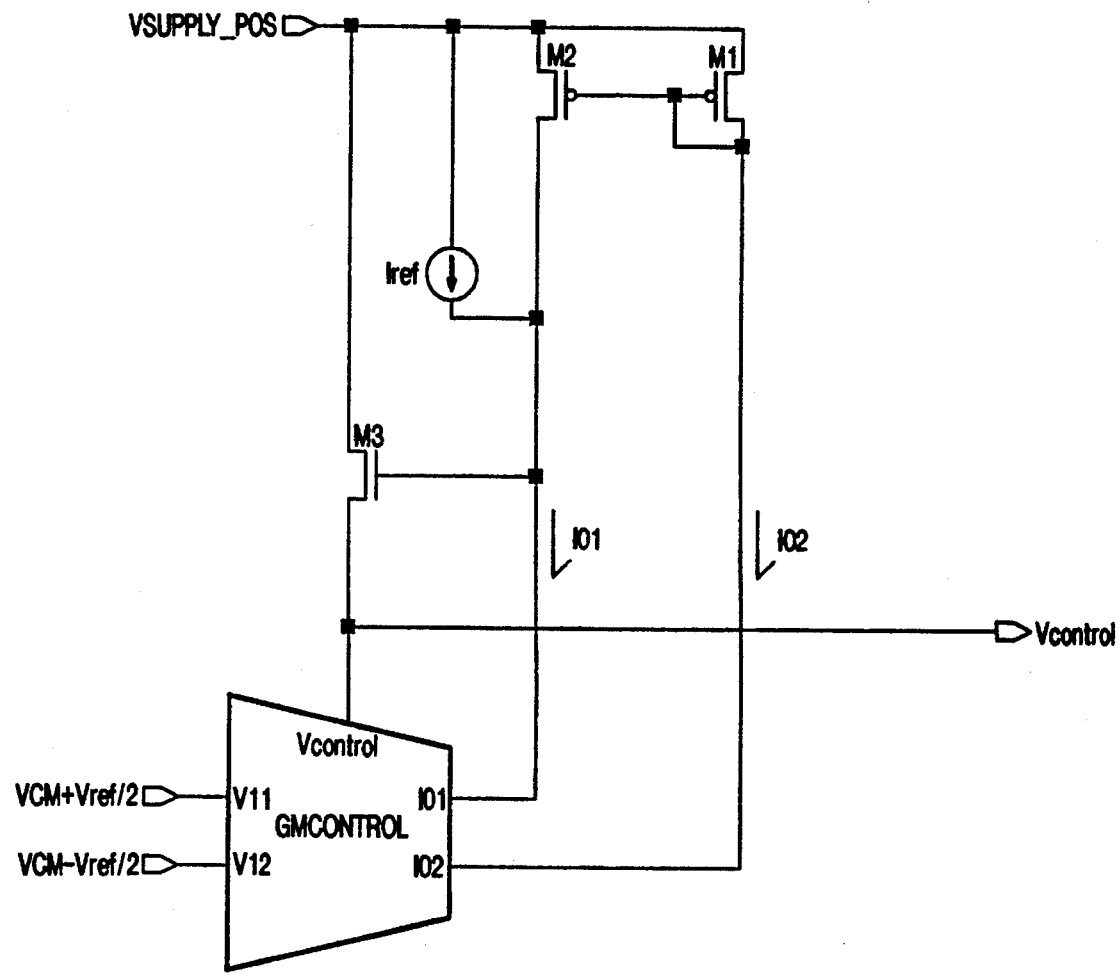
FIG. 26 is a circuit diagram of an embodiment of the present invention in which the control transconductor is comprised of a differential cascoded BiFET structure and in which a cascode mirror is used.

One skilled in the art will recognize that the present transconductance control invention is not limited to differential transconductance amplifiers of the cascoded BiFET type shown in the embodiment of FIG. 24. FIG. 26 is a circuit diagram of an embodiment of the present invention in which the voltage-controlled transconductance amplifier is shown as a general block GMCONTROL.

Figure 27:
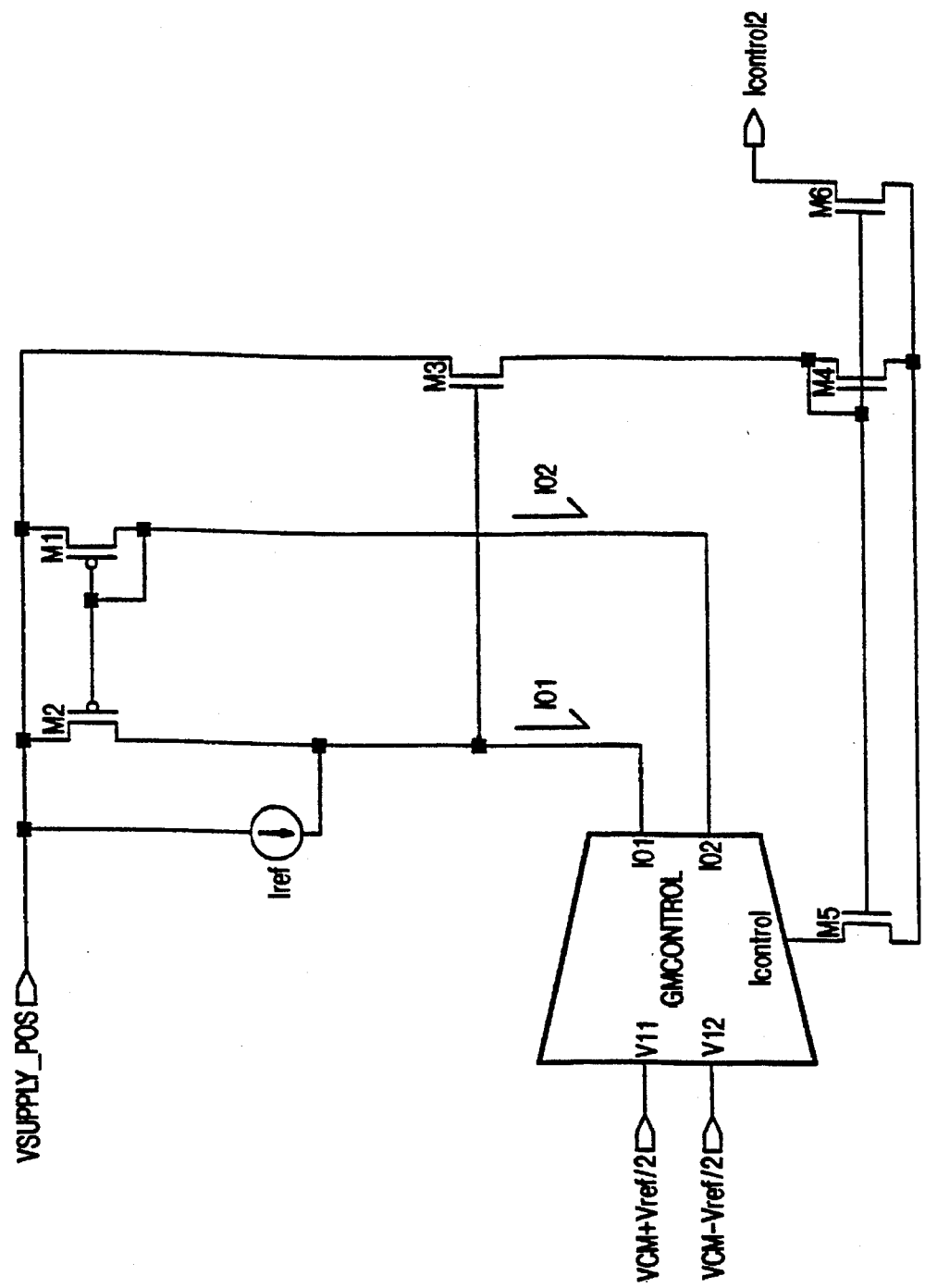
FIG. 27 is a circuit diagram of an embodiment of the present invention in which the control variable of the transconductor is a current (Icontrol) rather than a voltage.

FIG. 27 is a circuit diagram of an embodiment of the present invention in which the control variable of the transconductor is a current (Icontrol) rather than a voltage.

Figure 28:
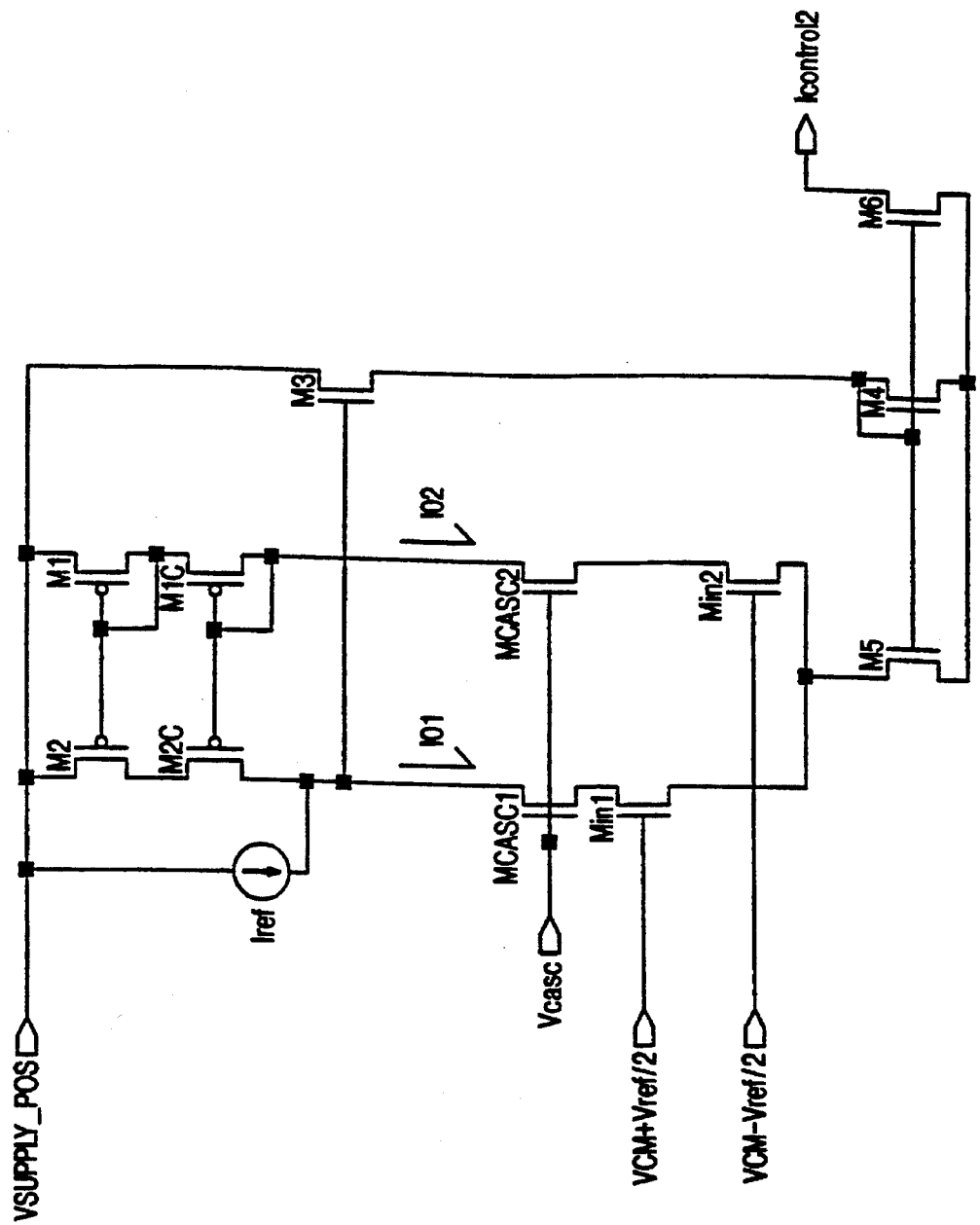
FIG. 28 is a circuit diagram of an embodiment of the present invention in which a current-source-biased MOSFET differential pair serves as the control transconductor and MOSFET cascode devices yield the desired high output impedance.

Operation is similar to that described previously, with Icontrol now under feedback control to maintain the desired $g_m$ value. For control of an identical signal-processing transconductor, MOSFET M6 is included to generate a copy of Icontrol. FIG. 28 is a circuit diagram of an embodiment of the present invention of the type shown in FIG. 27, in which current-source-biased MOSFET differential pair Min1, Min2 serves as the control transconductor and MOSFET cascode devices MCASC1 and MCASC2 yield the desired high output impedance.

There have been described herein various embodiments of transconductance amplifiers using FET differential input stages in combination with Gilbert multiplier output stages, as well as various $g_m$ control circuits. However, while the present invention has been disclosed and described with respect to certain preferred embodiments, it will be understood to those skilled in the art that the present invention may be varied without departing from the spirit and scope of the invention.

I claim:

1. A transconductance amplifier comprising:
   a FET differential input stage, the input stage having a current output; and,
   a Gilbert multiplier output stage coupled to the output of the input stage to amplify the current output of the FET differential input stage;
   the FET differential input stage having a pair of FET transistors each having a source, a drain and a gate, the drains of the pair of FET transistors being directly coupled to the Gilbert multiplier output stage, the sources of the pair of FET transistors being coupled to a bias voltage and the gates of the pair of FET transistors forming the differential input thereof.

2. The transconductance amplifier of claim 1 wherein the FET differential input stage is operated in the linear region.

3. The transconductance amplifier of claim 2 wherein the transconductance is set by adjustment of the common mode current in the Gilbert multiplier output stage.

4. The transconductance amplifier of claim 2 wherein the transconductance is set by adjustment of the drain-source voltage of the FET differential input stage.

5. The transconductance amplifier of claim 4 wherein the source voltage of the FET differential input stage is fixed and the transconductance is set by adjustment of the drain voltage of the FET differential input stage.

6. The transconductance amplifier of claim 1 wherein the FET differential input stage is operated in the saturation region.

7. The transconductance amplifier of claim 6 wherein the transconductance is set by adjustment of the common mode current in the Gilbert multiplier output stage.

8. The transconductance amplifier of claim 2 wherein the transconductance is set by adjustment of the source voltages of the FET differential input stage.

9. The transconductance amplifier of claim 1 further including circuitry for providing a bias current to the FET differential input stage approximating the common mode current there through minus a predetermined current component.

10. The transconductance amplifier of claim 9 wherein the FET differential input stage comprises a plurality of pairs of FET transistors each forming a separate differential input, the two FET transistors of each pair each being coupled in parallel with one of the transistors of each of the other pairs, whereby the transconductance amplifier may provide an output which is the arithmetic combination of the differential inputs thereto.

11. The transconductance amplifier of claim 9 wherein the transconductance of the FET differential input stage is adjusted by adjustment of the drain-source voltages of the FET differential input stage.

12. The transconductance amplifier of claim 1 wherein the FET differential input stage comprises a plurality of pairs of FET transistors each forming a separate differential input, the two FET transistors of each pair each being coupled in parallel with one of the transistors of each of the other pairs, whereby the transconductance amplifier may provide an output which is the arithmetic combination of the differential inputs thereto.

13. The transconductance amplifier of claim 12 wherein both of the transistors of one of the plurality of pairs of FET transistors is a different size from the transistors in another of the plurality of pairs of FET transistors, whereby the output of the transconductance amplifier is a scaled response to the multiple differential inputs thereto.

14. The transconductance amplifier of claim 1 further comprised of a FET coupled in series between each device of the FET differential input stage and the Gilbert multiplier output stage and having common source and drain regions, the gate of each FET coupled in series between one device of the FET differential input stage and the Gilbert multiplier output stage being coupled to the opposite input of the FET differential input stage.

15. The transconductance amplifier of claim 1 further comprised of a pair of bipolar junction transistors in a cascode connection and current source loads in series with the output devices of the Gilbert multiplier, the output of the Gilbert multiplier being taken between the collectors of the bipolar junction transistors and current source loads to provide a high output resistance.

16. The transconductance amplifier of claim 15 further comprised of a common mode feedback circuit to control the common mode voltage at the differential current output of the Gilbert multiplier.

17. The transconductance amplifier of claim 1 wherein the source voltage of the FET differential input stage is set by an emitter follower circuit.

18. The transconductance amplifier of claim 1 wherein the drain-source voltage of the FET differential input stage is set approximately by a current through a resistor.

19. The transconductance amplifier of claim 1 wherein the FET differential input stage comprises n-channel MOSFETS.

20. The transconductance amplifier of claim 1 wherein the FET differential input stage comprises p-channel MOSFETS.

21. The transconductance amplifier of claim 1 wherein the FET differential input stage comprises n-channel JFETS.

22. The transconductance amplifier of claim 1 wherein the FET differential input stage comprises p-channel JFETS.

23. The transconductance amplifier of claim 1 wherein the Gilbert multiplier output stage comprises npn bipolar junction transistors.

24. The transconductance amplifier of claim 1 wherein the Gilbert multiplier output stage comprises pnp bipolar junction transistors.

25. The transconductance amplifier of claim 1 wherein the Gilbert multiplier output stage comprises four bipolar junction transistors connected as a Gilbert multiplier.

26. The transconductance amplifier of claim 1 wherein the Gilbert multiplier output stage comprises two diodes and two bipolar junction transistors connected as a Gilbert multiplier.

27. A transconductance amplifier comprising:

a FET differential input stage; and, a Gilbert multiplier output stage;

the FET differential input stage having a pair of FET transistors each having a source, a drain and a gate, the drains of the pair of FET transistors being coupled to the Gilbert multiplier output stage through a pair of bipolar junction transistors in a cascode connection between the FET differential input stage and the Gilbert multiplier output stage, the bases of the bipolar junction transistors being coupled to a bias voltage, the sources of the pair of PET transistors being coupled to a bias voltage and the gates of the pair of FET transistors forming the differential input thereof.

28. The transconductance amplifier of claim 27 wherein the FET differential input stage comprises a plurality of pairs of FET transistors each forming a separate differential input stage, each FET differential input stage having a pair of bipolar junction transistors in a cascode connection between the FET transistors and the Gilbert multiplier output stage, the bases of the bipolar junction transistors of the MOSFET differential input stage being coupled in common to a respective bias voltage.

29. The transconductance amplifier of claim 28 further including circuitry for providing a bias current to the FET differential input stage or stages approximating the common mode current there through minus a predetermined current component.

30. The transconductance amplifier of claim 27 wherein the transconductance of the FET differential input stage is adjusted by adjustment of the base voltages of the bipolar junction transistors.

31. The transconductance amplifier of claim 28 further including circuitry for providing a bias current to the FET differential input stage or stages approximating the common mode current there through minus a predetermined current component.

32. A transconductance amplifier comprising:

a FET differential input stage, the input stage having a current output; and, a Gilbert multiplier output stage coupled to the output of the input stage to amplify the current output of the FET differential input stage;

the FET differential input stage having a pair of FET transistors each having a source, a drain and a gate, the sources of the pair of FET transistors being coupled to the Gilbert multiplier output stage, the drains of the pair of FET transistors being coupled to a bias voltage and the gates of the pair of FET transistors forming the differential input thereof.

* * * * *